United States Patent
Sasaki

(10) Patent No.: US 7,253,670 B2
(45) Date of Patent: Aug. 7, 2007

(54) PHASE SYNCHRONIZATION CIRCUIT AND SEMICONDUCTOR INTEGRATED CIRCUIT

(75) Inventor: Yasuhiko Sasaki, Tachikawa (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/288,176

(22) Filed: Nov. 29, 2005

(65) Prior Publication Data
US 2006/0114040 A1 Jun. 1, 2006

(30) Foreign Application Priority Data
Nov. 29, 2004 (JP) .............................. 2004-343661

(51) Int. Cl.
*H03L 7/00* (2006.01)
(52) U.S. Cl. ..................... 327/161; 327/152; 327/158
(58) Field of Classification Search .................. None
See application file for complete search history.

(56) References Cited

U.S. PATENT DOCUMENTS

| | | | | |
|---|---|---|---|---|
| 5,901,190 A * | 5/1999 | Lee | ........................ | 375/373 |
| 6,004,453 A * | 12/1999 | Benham et al. | ............. | 208/108 |
| 6,396,322 B1 * | 5/2002 | Kim et al. | .................... | 327/158 |
| 6,617,894 B2 * | 9/2003 | Yoon et al. | .................. | 327/161 |
| 6,933,758 B2 * | 8/2005 | Kim et al. | .................... | 327/161 |
| 2005/0146365 A1 * | 7/2005 | Kim et al. | .................... | 327/161 |

FOREIGN PATENT DOCUMENTS

JP   2002-152018   5/2002

OTHER PUBLICATIONS

"A 2.5-ns Clock Access, 250-MHZ, 256-Mb SDRAM with Synchronous Mirror Delay" by IEEE Journal of Solid State Circuits, vol. 31, No. 11, Nov. 1996.

* cited by examiner

*Primary Examiner*—Kenneth B. Wells
*Assistant Examiner*—An T. Luu
(74) *Attorney, Agent, or Firm*—Mattingly, Stanger, Malur & Brundidge, P.C

(57) ABSTRACT

A phase synchronization circuit comprises: a measurement delay line which includes a plurality of delay elements having different delay times and to which a first clock signal is inputted; a phase comparator line which includes a plurality of phase comparators in accordance with the measurement delay line and to which a signal from the measurement delay line and a second clock signal are inputted so as to measure a transition timing difference between the first clock signal and the second clock signal; and a generation delay line which includes a plurality of delay elements having different delay times in accordance with the measurement delay line and to which a signal from the phase comparator line and a third clock signal are inputted. The delay time of the respective delay elements is fixed.

6 Claims, 19 Drawing Sheets

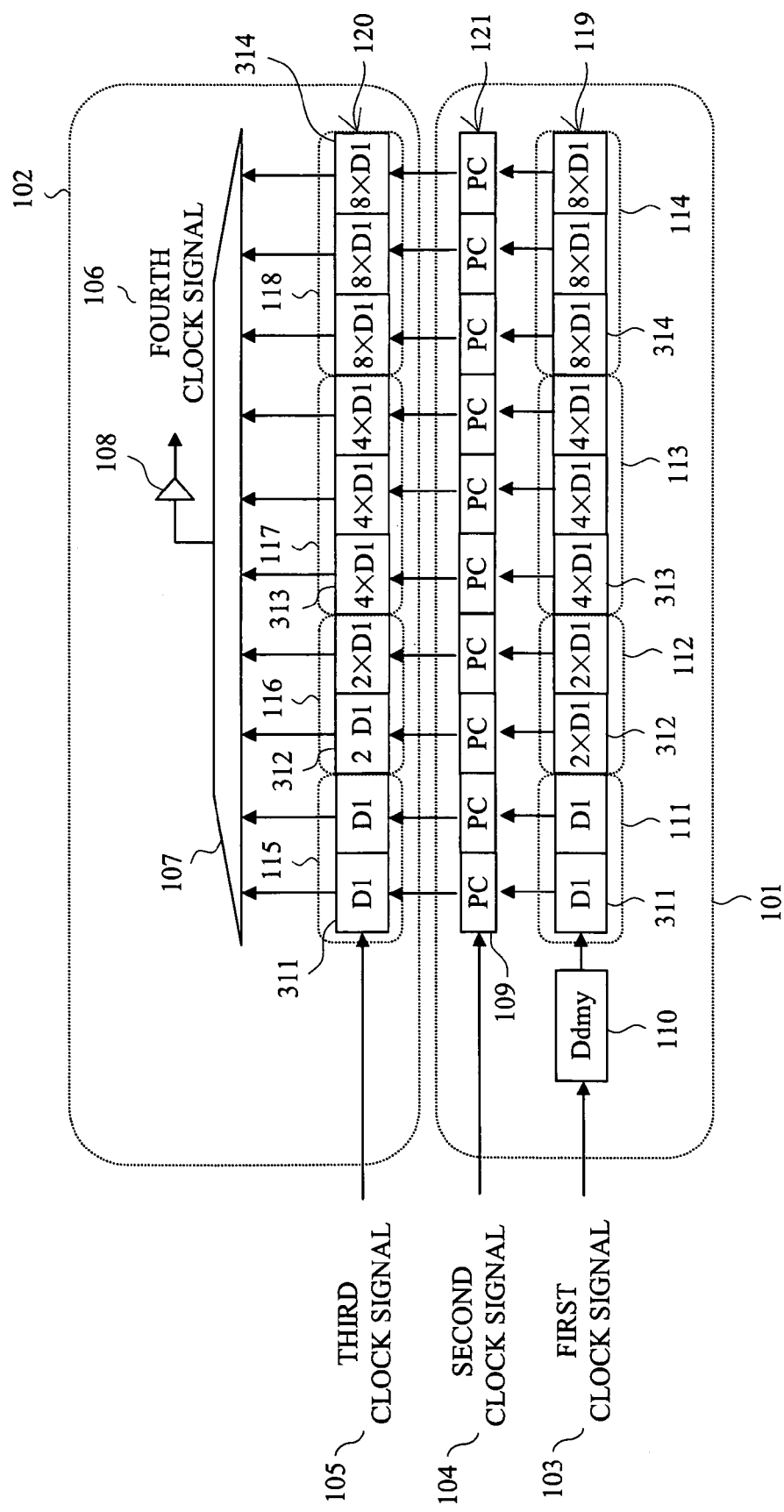

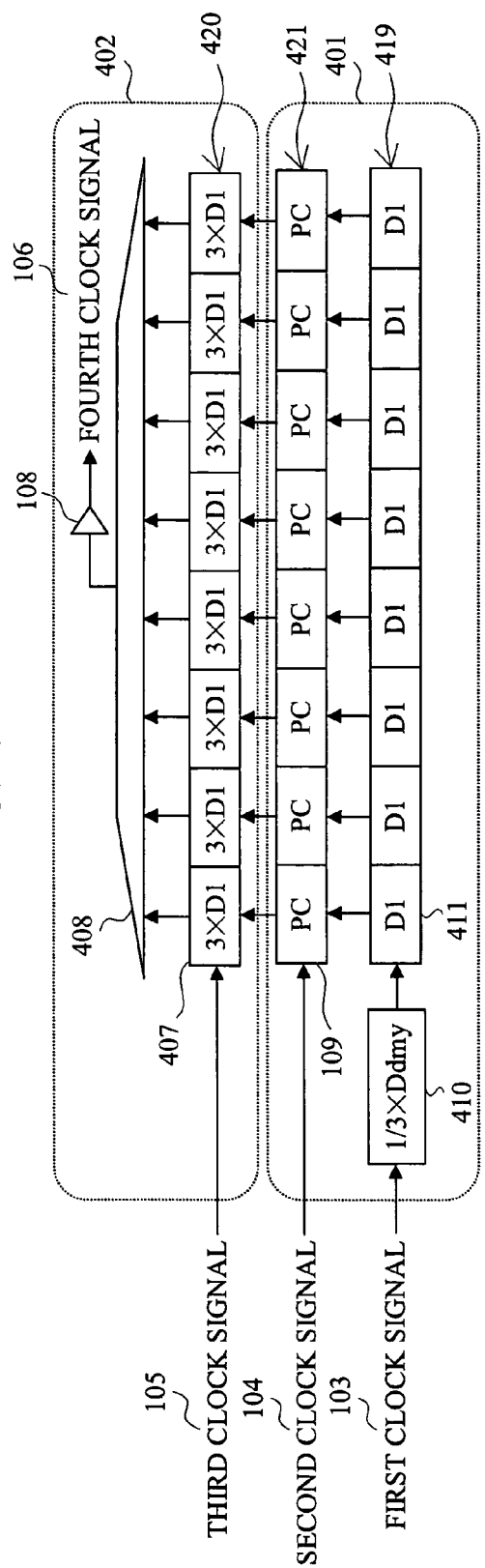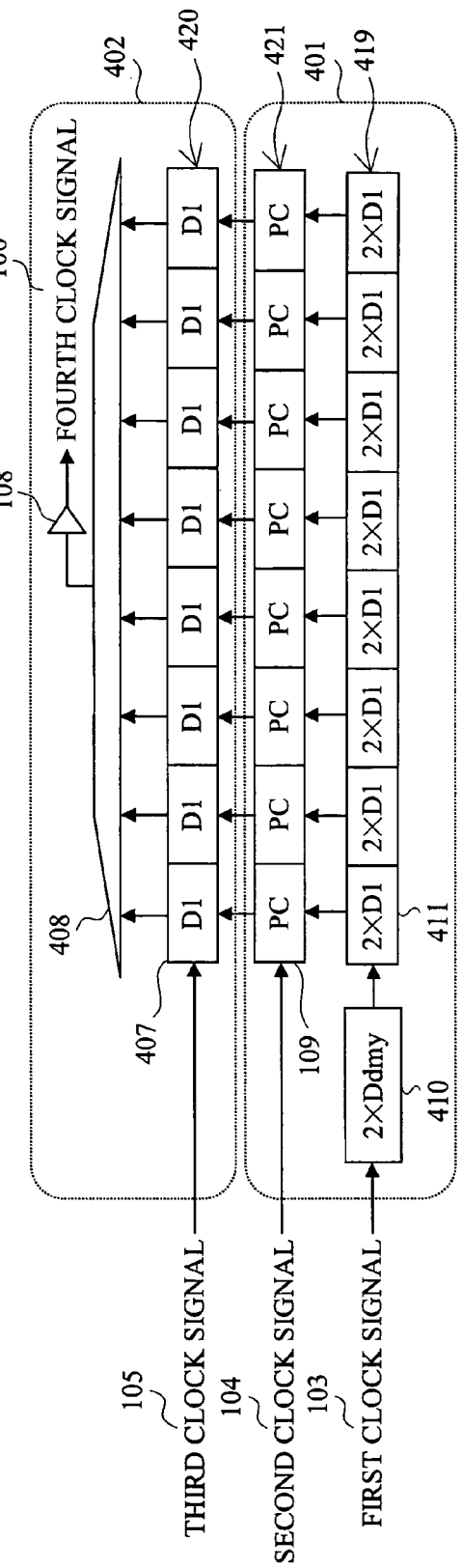

PHASE SYNCHRONIZATION CIRCUIT AND SEMICONDUCTOR INTEGRATED CIRCUIT

CROSS-REFERENCE TO RELATED APPLICATION

The present application claims priority from Japanese Patent Application No. JP 2004-343661 filed on Nov. 29, 2004, the content of which is hereby incorporated by reference into this application.

TECHNICAL FIELD OF THE INVENTION

The present invention relates to a phase synchronization circuit and a semiconductor integrated circuit device. More particularly, the invention relates to a technology effectively applied to a configuration of a DLL (Delay Locked Loop) circuit used for a microprocessor, a microcontroller, a signal processor, an image processor, a sound processor and various memories such as DRAM (Dynamic Random Access Memory), SRAM (Static Random Access Memory) and flash memory.

BACKGROUND OF THE INVENTION

In general, in semiconductor integrated circuit devices, signals inside and outside a semiconductor chip should be synchronized in time in order to accurately transmit/receive the signals inside and outside the semiconductor chip. In such synchronization, usually, an internal clock (or internal strobe) signal whose transition timing is accurately controlled is generated in order to maintain a constant timing relationship with transition timing of a clock (or strobe) signal inputted from the outside of the semiconductor chip, and the internal clock signal is utilized for acquiring a data signal.

An object, of the phase synchronization circuit mentioned above is to adjust the timing at the transmission/reception of the signals inside and outside the chip to minimize an undesired influence such as miss-acquisition of data value. In general, as to the time until phases are synchronized, it is desired that the phase synchronization is completed in a shorter time.

Meanwhile, for the purpose of reducing the semiconductor chip cost, it is preferable that the circuit is realized with the smallest possible occupying area on the chip or with the smallest possible number of elements and gates.

When applications to mobile devices or utilization of low-cost package are considered, it is desirable that the circuit is operated by lower electric power (electric power at the time of operation and standby).

As a technology relating to such a phase synchronization circuit, for example, the following technologies are disclosed.

In "IEEE Journal of Solid-State Circuits" (U.S.), November 1996, vol. 31, No. 11, pp. 1656-1668 (Non-Patent Document 1), two delay lines FDA and BDA are arranged in parallel in opposite directions, a control circuit MCC is arranged therebetween in parallel with them, and a load circuit having the same delay time as that of a clock driver connected to an output of the delay line BDA is designed as a dummy in advance so as to connect with an input of the delay line FDA. This circuit detects a position where phases are synchronized in the delay line FDA based on the delay line FDA and the control circuit MCC, and inputs a clock from the same position in the delay line BDA to transmit the clock in a direction opposite to the delay line FDA. As a result, high-speed synchronization where phases are synchronized in the delay of two cycles is realized.

Japanese Patent Application Laid-Open Publication No. 2002-152018 (Patent Document 1) discloses an example where a variable delay element and a fixed delay element are combined to form a synchronization circuit with a small number of delay tiers. The variable delay element controls a power source voltage so as to change its delay time.

In both Non-Patent Document 1 and Patent Document 1, the delay time created in the synchronization circuit is controlled so that transition (rise or fall) timings of signals of inside and outside are aligned only at a timing equal to a clock cycle of a reference signal given as an input or a timing which is integral multiple of the clock cycle.

SUMMARY OF THE INVENTION

As a result that the inventor has examined the technologies of the phase synchronization circuit described above, the followings became apparent.

FIG. 2 illustrates the phase synchronization circuit which has been examined as a premise of the present invention by the inventor.

The phase synchronization circuit shown in FIG. 2 is composed of two circuit blocks of a measurement circuit 201 and a delay generation circuit 202. Each of the measurement circuit 201 and the delay generation circuit 202 has a delay line 212 for measuring delay time (hereinafter, referred to as measurement delay line) and a delay line 213 for generating a delay clock signal (hereinafter, referred to as generation delay line). Each of the measurement delay line 212 and the generation delay line 213 is composed of a plurality of delay elements 211 and 207 with the same delay time (D1).

The measurement circuit 201 has a phase comparator line 214 composed of a plurality of phase comparators 209. The phase comparator line 214 has a phase comparing mechanism that determines whether a phase of a signal obtained from a first clock signal 203 which has passed through the measurement delay line via a fixed delay element (Ddmy) 210 for phase adjustment and a phase of the second clock signal 204 match with each other. Further, the delay generation circuit 202 has a convergence circuit 208 and an output buffer 108 that outputs a fourth clock signal.

The first clock signal 203 inputted into the measurement circuit 201 passes through a fixed delay element 210 for phase adjustment, and then advances to the measurement delay line 212 composed as an assembly of the delay elements 211. Thereafter, the outputs from the delay elements 211 are outputted to the phase comparators 209.

Meanwhile, the second clock signal 204 is inputted into the phase comparators 209 (in the drawing, the second clock signal is inputted to the left comparator for convenience of description, but it is inputted into all the comparators. This is true of all of the drawings in the following description of the specification). The phase comparators 209 generate a matching/mismatching signal in accordance with a phase relationship between the two inputs. The generated matching/mismatching signals are outputted to the delay generation circuit 202.

The delay generation circuit 202 has a plurality of delay elements 207 that delay signals by the time (D1) which is the same as the delay elements 211 in the measurement circuit 201, and the generation delay line 213 is composed of a series of them. A third clock signal 205 is inputted into the generation delay line 213, and a significant signal is outputted only from tiers in positions to which the matching signals from the measurement circuit 201 are outputted (hereinafter, "phase matching tier"). Signals from all the tiers including the significant signals become one output by means of the convergence circuit 208, and the one output passes through the output buffer 108 so as to become a desired fourth clock signal 206.

The convergence circuit 208 is typically realized as a multi-input OR circuit in the configuration of FIG. 2. The fixed delay element 210 for phase adjustment in the measurement circuit 201 is configured so as to compensate the delay times of the convergence circuit 208 and the output buffer 108.

In general, there are changes in external conditions and variations in characteristics of the elements, but in order to attain a proper operation regardless of the changes and the variations, the measurement delay line 212 and the generation delay line 213 have a certain number of delay tiers, so that the proper operation can be performed under any conditions.

With such a configuration, the third clock signal 205 is delayed by the time equal to the time difference between the first clock signal 203 and the second clock signal 204 so as to be the fourth clock signal 206.

Incidentally, a problem of such a configuration is that the circuit scale increases when a frequency range of the operation is widened. More specifically, in order to satisfy the matching accuracy of the phases required when the range of the operating frequency is the widest, it is necessary to shorten the delay time (D1) of the delay elements 211 in the measurement delay line 212 and the generation delay line 213.

However, in the case where the number of the tiers at the time of the lowest frequency is determined by using the delay elements with the delay time determined in such a manner, when the operating frequency range is wide, extremely many tiers of delay elements are required. When the number of tiers of the delay elements is large, a lot of phase comparators are similarly required, and thus the number of the elements and the number of gates increase. Further, this increases an area on the chip and an electric power.

Further, the phase synchronization circuit described in the non-patent document 1 has a problem that, when the operating frequency range is widened, the circuit scale increases. More specifically, in order to satisfy the matching accuracy of the phases required when the operating frequency range is the widest, it is necessary to shorten the delay time per tier of the delay element in the delay line. However, in the case where the number of the tiers at the time of the lowest frequency is determined by using the delay elements with the delay time determined in such a manner, when the operating frequency range is wide, extremely many tiers of the delay elements are required. When the number of the tiers of the delay elements is large, a lot of the delay comparators are similarly required, and thus the number of the elements and the number of the gates increase. This increases the area on the chip and the electric power of the phase synchronization circuit.

Also, in the phase synchronization circuit described in Patent Document 1, since the configurations of the fixed delay element and the variable delay element are combined, the number of the tiers of the delay elements can be reduced. However, in order to configure the variable delay element, a circuit mechanism that controls a power source voltage is required, and thus the time until the phase synchronization becomes long. More specifically, a voltage should be gradually adjusted to high or low level until the power source voltage comes to a desired level. Further, such a control mechanism has to use a filter element equivalent to one used in a so-called PLL (Phase Locked Loop) circuit in order to prevent oscillation of the control mechanism, and such a filter element increases the circuit area and the electric power. In addition, since such a control circuit is a so-called analog circuit, an influence of its manufacturing process is large, and it is necessary to readjust the elements in order to change the process.

Therefore, an object of the present invention is to provide a phase synchronization circuit in which, even when an operating frequency range is widened, phase synchronization can be completed in a short time (locked at a high speed) without increasing an occupying area on a chip, the number of gates and an electric power.

Another object of the present invention is to provide a phase synchronization circuit which is hardly influenced by a manufacturing process.

Still another object of the present invention is to provide a circuit which is capable of not only generating internal delay time so that signal transition timings of inside and outside are aligned only at a timing equal to a clock cycle of a reference signal given as an input or a timing which is integral multiple of the clock cycle, but also generating internal delay time so that transition timings are aligned at a timing which is one-nth or n times of the clock cycle (namely, not limited to the integral multiple).

The above and other objects and novel characteristics of the present invention will be apparent from the description of this specification and the accompanying drawings.

The representative ones of the inventions disclosed in this application will be briefly described as follows.

More specifically, the phase synchronization circuit according to the present invention comprises: a first delay line which includes a plurality of delay elements having different delay times and to which the first clock signal is inputted; a phase comparator line which includes a plurality of phase comparators in accordance with the first delay line and to which a signal from the first delay line and the second clock signal are inputted so as to measure a transition timing difference between the first clock signal and the second clock signal; and a second delay line which includes a plurality of delay elements having different delay times in accordance with the first delay line and to which a signal from the phase comparator line and the third clock signal are inputted, wherein the delay time of the plurality of delay elements in the first delay line and the second delay line is fixed. Note that it is preferable that, in the first delay line, delay time of the delay element on a first tier side where the first clock signal reaches earlier is short and delay time of the delay element on a latter tier side where the first clock signal reaches later is long.

Also, a phase synchronization circuit according to the present invention comprises: a first delay line which includes a plurality of delay elements and to which the first clock signal is inputted; a phase comparator line which includes a plurality of phase comparators in accordance with the first delay line and to which a signal from the first delay line and the second clock signal are inputted so as to measure a transition timing difference between the first clock signal and the second clock signal; and a second delay line which includes a plurality of delay elements in accordance with the first delay line and to which a signal from the phase comparator line and the third clock signal are inputted, wherein a ratio of delay time of the delay elements in the first delay line to delay time of the delay elements in the second delay line is constant. Note that, a value of the ratio of delay time of the delay elements is any values other than 1, and thus, the delay clock signal of constant multiple can be obtained.

Further, the semiconductor integrated circuit device according to the present invention includes the above-described phase synchronization circuit.

The effects obtained by representative aspects of the present invention will be briefly described below.

According to the phase synchronization circuit of the present invention, even when an operating frequency range is wide, the synchronization can be completed in a short time without increasing the number of elements, the number of gates, and an electric power.

BRIEF DESCRIPTIONS OF THE DRAWINGS

FIG. 3 is a block diagram illustrating a configuration example of a measurement delay line and a generation delay line in the phase synchronization circuit shown in FIG. 1 according to the first embodiment of the present invention;

FIG. 4A is a block diagram illustrating a basic configuration of the phase synchronization circuit according to a second embodiment of the present invention;

FIG. 4B is a block diagram illustrating a basic configuration of the phase synchronization circuit according to a second embodiment of the present invention;

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

First Embodiment

Figure 1:
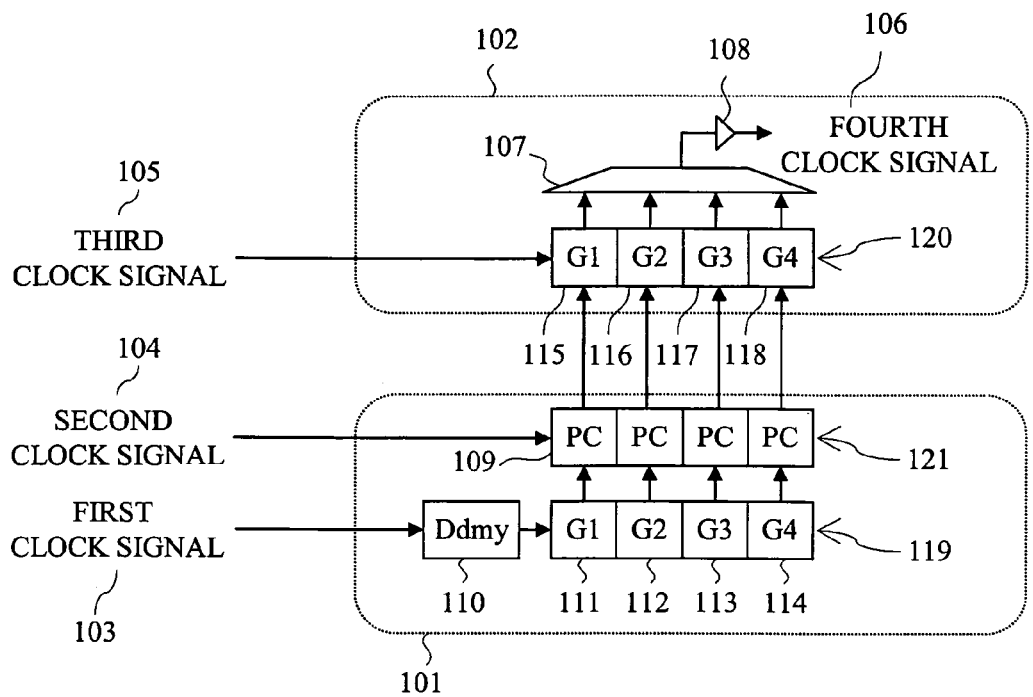
FIG. 1 is a block diagram illustrating a basic configuration of a phase synchronization circuit according to a first embodiment of the present invention.

FIG. 1 is a block diagram illustrating a basic configuration of a phase synchronization circuit according to the first embodiment of the present invention.

With reference to FIG. 1, one example of the basic configuration of the phase synchronization circuit according to the first embodiment will be described below. The phase synchronization circuit of the first embodiment is, for example, a DLL and is composed of a measurement circuit 101, a delay generation circuit 102 and the like. The measurement circuit 101 is configured by a fixed delay element for phase adjustment 110 (delay time; Ddmy), a measurement delay line 119 for measuring delay time obtained by connecting a plurality of delay tiers 111, 112, 113 and 114 including delay elements (delay time; G1, G2, G3 and G4)

each having different delay times in one line, a phase comparator line 121 obtained by connecting a plurality of phase comparators 109 in one line, and the like. The delay generation circuit 102 is composed of a generation delay line 120 for generating a delay clock signal (fourth clock signal) obtained by connecting delay tiers 115, 116, 117 and 118 including delay elements (delay time; G1, G2, G3 and G4) each having different delay times corresponding to the measurement delay line 119 in one line, a convergence circuit 107, an output buffer 108 and the like. The fixed delay element 110 for phase adjustment is composed so as to compensate the delay time of the convergence circuit 107 and the output buffer 108. Further, the delay tiers 115, 116, 117 and 118 in the generation delay line 120 are circuits that delay signals only by the times (G1, G2, G3 and G4) which are the same as the delay tiers 111, 112, 113 and 114 in the measurement delay line 119.

A first clock signal 103 is inputted via the fixed delay element 110 to the measurement delay line 119 in the measurement circuit 101. Further, a third clock signal 105 is inputted into the generation delay line 120 in the delay generation circuit 102. In the measurement delay line 119 and the generation delay line 120, unit delay time (G1) of the delay element is set to be short in the delay tier 111 at the first tier where the first clock signal 103 reaches relatively earlier, and unit delay times (G2, G3 and G4) are set to be longer in the delay tiers (in the order of 112, 113 and 114) at the latter tiers where the first clock signal 103 reaches later sequentially (G1<G2<G3<G4). Also, a second clock signal is inputted into the phase comparator line 121, and a fourth clock signal (delay clock signal) is outputted from the delay generation circuit 102.

FIG. 3 is a diagram illustrating a concrete configuration example of the measurement delay line 119 and the generation delay line 120 in the phase synchronization circuit of FIG. 1. In the configuration example shown in FIG. 3, in the measurement delay line 119, the delay tier 111 is composed of two delay elements 311 (unit delay time; D1), the delay tier 112 is composed of two delay elements 312 (unit delay time; 2·D1), the delay tier 113 is composed of three delay elements 313 (unit delay time; 4·D1), and the delay tier 114 is composed of three delay elements 314 (unit delay time; 8·D1). Also, the unit delay times are set to be longer sequentially from the first tier side to the latter tier side. The delay tiers 115, 116, 117 and 118 of the generation delay line 120 are configured in the same manner.

The phase synchronization circuit according to the first embodiment receives the first clock signal (reference clock signal 1) 103 and the second clock signal (reference clock signal 2) 104 shown in FIG. 1 and FIG. 3 as inputs. The phase synchronization circuit generates the fourth clock signal (generated output clock signal) 106 which is obtained by delaying a third clock signal (generation input clock signal) 105 by the time equal to a time difference between the transition timings (rise timing pair or fall timing pair) of the two signals 103 and 104.

The first clock signal 103 and the second clock signal 104 may be independent signals, the same signals or distributed signals. In general, the performance of the elements fluctuates in each of the semiconductor chips and due to external conditions such as fluctuations in temperature and voltage. The phase synchronization circuit has to generate a desired generated output clock signal even if such fluctuations are present.

Next, the effects of the phase synchronization circuit according to the first embodiment will be described below.

First, an operation when an operating frequency is high will be described. When an operating frequency range is wide, unit cycle time (hereinafter, referred to as cycle time) which is an inverse of the frequency becomes short. Therefore, the delay time generated by the phase synchronization circuit becomes short delay time similarly. More specifically, the time difference between the first clock signal 103 and the second clock signal 104 becomes a comparatively short time.

Therefore, a phase matching tier is a side where the first clock signal 103 reaches comparatively earlier in the plural delay tiers. In general, the phase synchronization circuit should operate so that a time difference between the third clock signal 105 and the fourth clock signal 106 is equal to the time difference between the first clock signal 103 and the second clock signal 104.

An error of the transition timing difference between the third clock signal 105 and the fourth clock signal 106 (hereinafter, referred to as jitter) has to be a small value so that a constant level (ratio) is satisfied with respect to the cycle time. When the operating frequency range is wide, since the cycle time is short, permissible time of the jitter has to be sufficiently short.

In the configuration according to the first embodiment shown in FIG. 1, since the unit delay time is set to be short in the delay element of the delay tier 111 at the first tier where the first clock signal 103 reaches comparatively earlier, the minimum unit for determining the phase matching is short. Therefore, the permissible time of the jitter can be satisfied.

On the other hand, the operation when the operating frequency is low will be described below. When the operating frequency is low, since the cycle time is long, the permissible time of the jitter becomes comparatively longer. According to the configuration of the first embodiment, in the delay elements of the delay tiers (in the order of 112, 113 and 114) on the latter tier side where the first clock signal 103 reaches later, their unit delay times are set to be longer sequentially. As the operating frequency becomes lower, the permissible time of the jitter becomes longer. Therefore, even when the minimum unit for determining the phase matching becomes large, the accuracy of the phase matching is not degraded in the first embodiment.

When the phase synchronization circuit that performs the operations at both of the high operating frequency and the low operating frequency is considered, the number of delay tiers increases in the conventional phase synchronization circuits, but the number of the delay tiers can be greatly reduced in the phase synchronization circuit according to the first embodiment.

More specifically, in the conventional phase synchronization circuits, since the delay elements having the uniform unit delay time are used to form the measurement delay line and the generation delay line, in order to satisfy the permissible time of the jitter, the unit delay time has to be set so that the permissible time (short delay time) is satisfied at a high operating frequency.

Therefore, even when the phase synchronization circuit is operated at a low operating frequency, the phases can be matched by similarly short delay time unit. Although originally the time is comparatively longer than the permissible time of the jitter at a low operating frequency, the phases are matched by short time unit, and thus extremely many numbers of delay tiers are required for proper operation even when the external conditions fluctuate or the characteristics of the elements vary.

In the first embodiment, in the case where the operating frequency is low, the unit delay amount in the measurement delay line 119 and the generation delay line 120 corresponding to the portion where the phases are matched at the low operating frequency is set to be larger by utilizing that originally the permissible time of the jitter may be comparatively long. Therefore, the number of the delay tiers can be reduced. When the number of the delay tiers is reduced, the number of the gates is also reduced accordingly, which reduces the occupying area on the chip and the electric power.

Further, the phase synchronization circuit according to the first embodiment has another advantage as to lowering of the electric power. More specifically, when the time until the phase synchronization is completed is considered, phase matching/mismatching signals are generated in next cycle in which two inputs to the phase comparators 109 are prepared, and that time may be the time until the fourth clock signal 106 is outputted by using the resultant number of the tiers. For this reason, in a typical manner, the synchronization can be completed (locked) in one to several cycles.

For this reason, even when the phase synchronization circuit is frequently operated and stopped, return time until the synchronization is not influenced. Such a characteristic is useful in the system in which low electric power operation is required.

This is because, since the time until the completion of the synchronization is usually long in a synchronization circuit such as PLL, it takes a time until the clock synchronization is returned. For this reason, the synchronization circuit cannot be stopped even in a circumstance that the original operation of the system is not performed. On the contrary, in the phase synchronization circuit according to the first embodiment, since such a problem does not occur, the operation can be frequently started and stopped, and this circuit is suitable for forming the low-electric power system.

Figure 5:
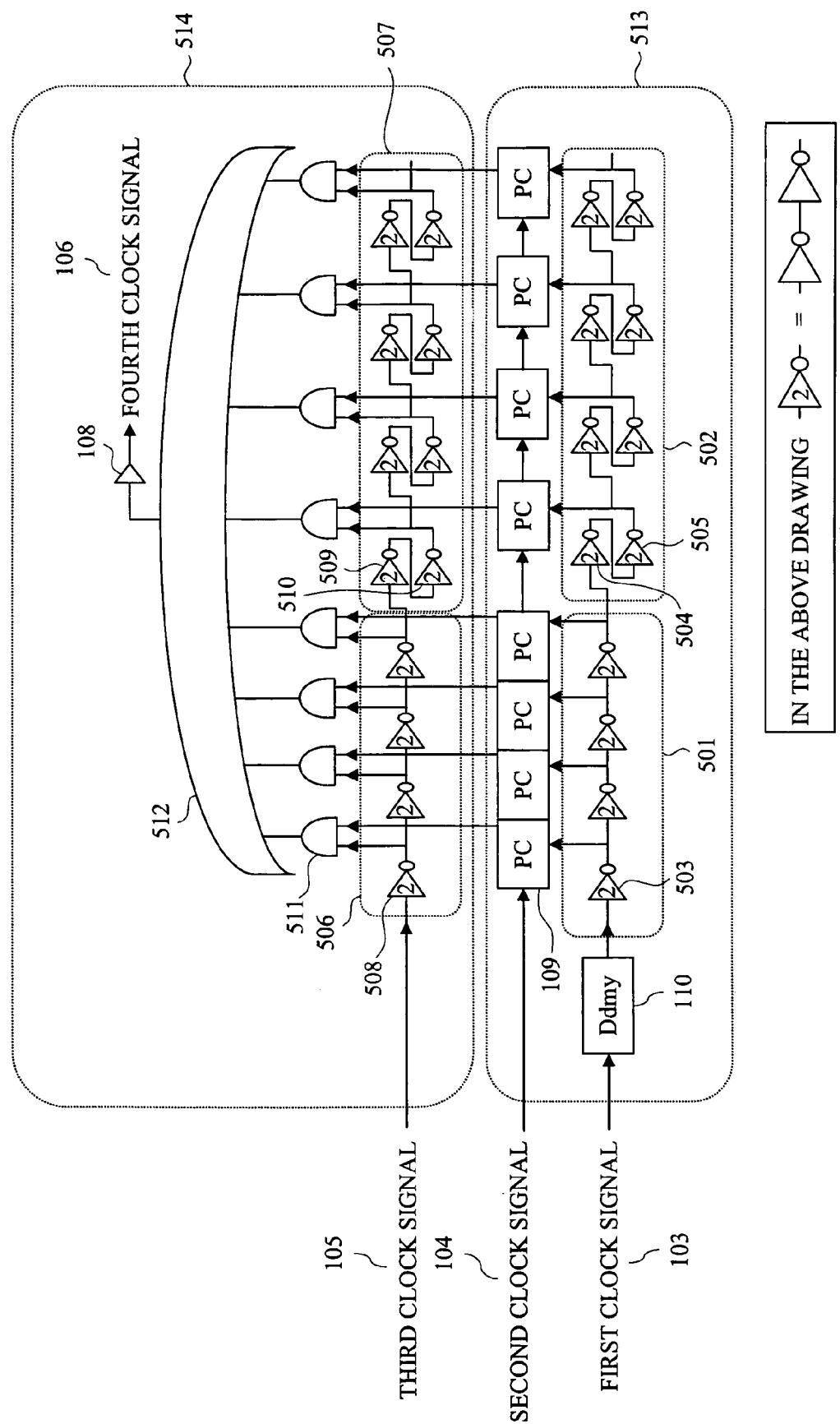
FIG. 5 is a circuit diagram illustrating a configuration example of the phase synchronization circuit according to the first embodiment of the present invention.

FIG. 5 is a circuit diagram illustrating a detailed configuration of the phase synchronization circuit according to the first embodiment. In the measurement delay line and the generation delay line shown in FIG. 5, inverter delays 503, 504, 505, 508, 509 and 510 (those having "2" in the inverter symbols in the drawing) in which two tiers of inverter gates are used as the unit delay element are delay elements. Note that the use of the inverter gates is not indispensable, and various gates such as NAND gate, AND gate, NOR gate and OR gate can be used as the unit delay element. Also, other than such logical gates, any circuits can be used as long as they have constant delay.

In FIG. 5, the measurement delay line in the measurement circuit 513 is composed of two delay tiers 501 and 502 each having different unit delay times of the delay elements. In the delay tier 501 which is close to the input of the first clock signal 103, the unit delay time is equal to one tier of the inverter delay 503. Meanwhile, in the delay tier 502 which is far from the input, the unit delay time is equal to two tiers of the inverter delays 504 and 505. In such a configuration, in the operation at a low frequency, the phase matching is compared in a time unit which is larger than that in the operation at a high frequency as mentioned above. However, when the ratio to the cycle time is considered, the deterioration does not occur in the permissible time of the jitter because the frequency of the clock signal is low.

Figure 6:
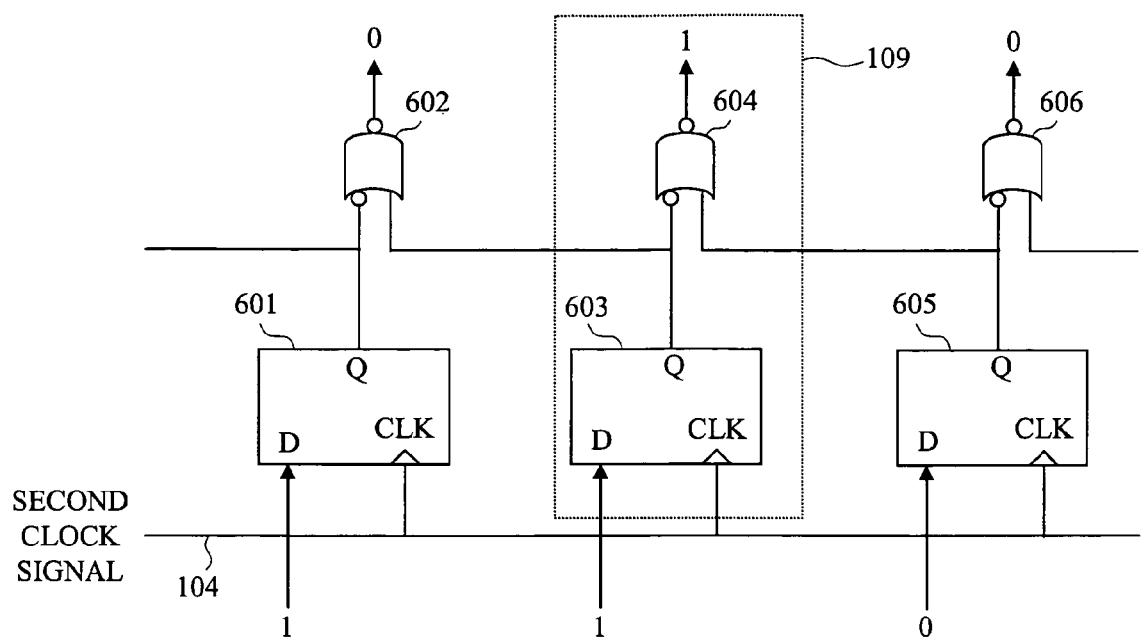
FIG. 6 is a circuit diagram illustrating a configuration example of a phase comparator according to the first embodiment of the present invention.

FIG. 6 illustrates one example of the phase comparator 109 in FIG. 5. The phase comparator 109 is composed of flip-flops 601, 603 and 605 and gates 602, 604 and 606 which invert one input and then obtain NOR of the inverted input and another input so as to take a logic between the previous tier and the next tier. When such gates are used, the flip-flops 601, 603 and 605 can generate signals so that "1" is outputted from only a boundary tier at which transition of the output from the measurement delay tier is carried out in time before the transition of the second clock signal 104 and "0" is outputted from the other tiers, and these outputs can be transmitted to the delay generation circuit 514.

When the circuit scale of the phase comparators 109 is considered, in general, the number of the elements in the flip-flop circuit is much larger than that in a gate such as the inverter, and the gates between the tiers are required as shown in FIG. 6. For this reason, it is found that the number of the phase comparators 109 occupies a large part in the number of the elements in the phase synchronization circuit. In the first embodiment, since the number of tiers of the delay elements is reduce in comparison with the conventional one, the number of the phase comparators 109 is also small, and thus the small circuit in which the number of elements, the chip area and the electric power are reduced can be realized.

As shown in FIG. 5 and FIG. 6, in the phase synchronization circuit according to the first embodiment, all the components can be composed only by so-called digital circuits. In such a case, different from the conventional phase synchronization circuits composed of analog circuits, it possesses the resistance in operation against the change in the process to be used when the device is manufactured, and thus the number of steps to redesign each process is noticeably reduced.

Further, stabilizing time which is required in an analog control (for example, voltage stabilizing time of a voltage control oscillator or the like, which is the time until the lock in the PLL using the analog circuits) is not required, and thus the time until the lock can be less than several times as long as the cycle time for determining the output as the digital circuit.

Figure 7:
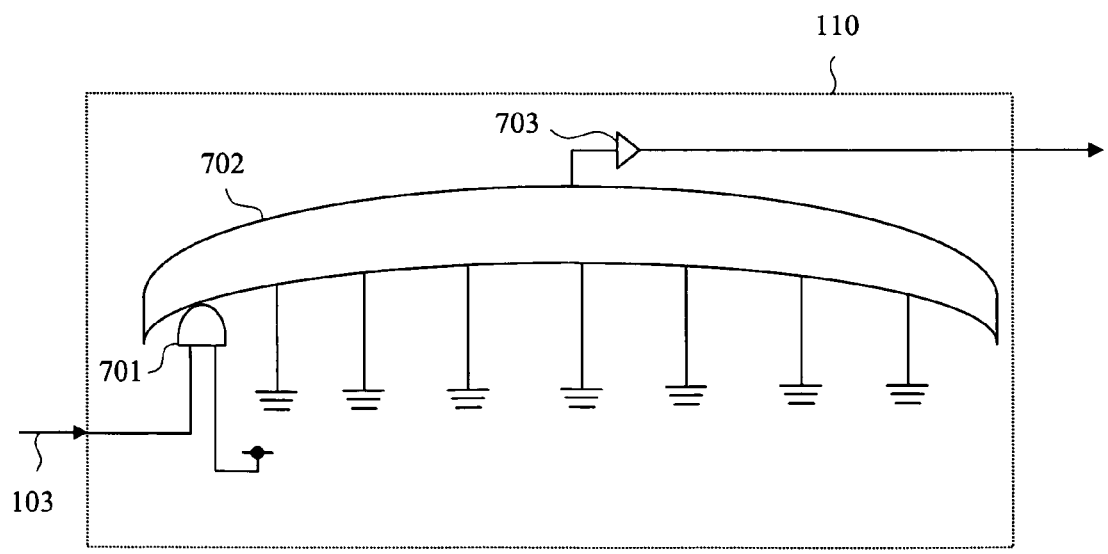
FIG. 7 is circuit diagram illustrating a configuration example of a fixed delay element for phase adjustment according to the first embodiment of the present invention.

FIG. 7 is a circuit diagram illustrating one example of a configuration of the fixed delay element 110 for phase adjustment shown in FIG. 5. As shown in FIG. 7, in the fixed delay element 110, a circuit through which a signal passes except for the delay elements in the generation delay line is formed in a pseudo manner on a path where the third clock signal 105 passes until it is delayed and outputted as the fourth clock signal 106.

In FIG. 7, an AND gate 701 and a multi-input OR circuit 702 as the convergence circuit that makes only the phase matching tier effective and an output buffer 703 are formed. More specifically, an equivalent circuit is formed in which the AND gate 701 corresponds to an AND gate 511, the multi-input OR circuit 702 corresponds to an OR circuit 512, and the output buffer 703 corresponds to the output buffer 108.

Second Embodiment

FIG. 4A and FIG. 4B are block diagrams illustrating basic configurations of the phase synchronization circuit according to the second embodiment of the present invention.

The phase synchronization circuit according to the second embodiment can generate internal delay time so that transition timings are aligned within a time difference which is one-nth or n times of the clock signal cycle (namely, not limited to the integral multiple).

More specifically, the phase synchronization circuit according to the second embodiment sets the delay times of the delay elements in one delay tier which receive and transmit phase matching/mismatching signal in the measurement delay line and the generation delay line so that they become the same value, and instead of it, the delay times keep a certain constant ratio relationship.

For example, the unit delay time in the measurement delay line is set to be twice the unit delay time in the generation delay line or to be half on the contrary, so that the constant ratio relationship is established. Further, in not only the delay line but also the fixed delay element for phase adjustment, the delay time which is necessary for phase compensation at the time of generating the same delay should be set so as to keep this constant ratio relationship. FIG. 4A and FIG. 4B illustrates examples of such a configuration.

FIG. 4A illustrates the configuration in the case where the delay to be generated is three times as long as the time difference between the first clock signal and the second clock signal, and FIG. 4B illustrates the configuration in the case where the delay to be generated is half of the time difference between the first clock signal and the second clock signal.

The phase synchronization circuit according to the second embodiment is composed of the measurement circuit 401, the delay generation circuit 402 and the like. The measurement circuit 401 is composed of the fixed delay element 410 for phase adjustment, the measurement delay line 419 for measuring the delay time obtained by connecting the delay elements 411 having the same delay time in one row, the phase comparator line 421 obtained by connecting the plural phase comparators 109 in one row, and the like. The delay generation circuit 402 is composed of the generation delay line 420 obtained by connecting the delay elements 407 having delay time of a constant ratio in accordance with the measurement delay line 419 in one row, the convergence circuit 408, the output buffer 108, and the like.

In this phase synchronization circuit, the delay elements 411 constituting the measurement delay line 419 and the delay elements 407 constituting the generation delay line 420 are in a constant ratio relationship, and in the fixed delay element 410 for phase adjustment, the constant ratio is maintained with respect to the delay time required for phase compensation at the time of generating the same delay. More specifically, the constant ratio in FIG. 4A is the ratio of the measurement delay line to the generation delay line of 1:3. In this case, the fixed delay element 410 for phase adjustment is set to be ⅓ of the delay time required for phase compensation at the time of generating the same delay. Further, the constant ratio in FIG. 4B is the ratio of the measurement delay line to the generation delay line of 2:1, and in this case, the fixed delay element for phase adjustment is set to be twice the delay time required for phase compensation at the time of generating the same delay.

In the configurations shown in FIG. 4A and FIG. 4B, although the delay time is not equal to the time difference between the first clock signal and the second clock signal, the phase synchronization can be performed so that the constant ratio relationship is established with respect to the time difference in the following manner.

That is to say, in FIG. 4A, when the first clock signal is inputted, the signal is first delayed by the fixed delay element 410 for phase adjustment. In this fixed delay element 410, the signal is delayed only by the time which is ⅓ of the delay to be added in the output buffer 108 and the convergence circuit 408 (⅓D dmy). Next, this signal is inputted into the measurement delay line 419 and advances through it. The phase comparator line 421 composed of the plural phase comparators 109 operates to detect the matching of phases between the second clock signal 104 and the outputs from the tiers of the plurality of delay elements 411 in the measurement delay line 419. Matching signals from the tiers where the phases match are outputted to the delay generation circuit 402. Meanwhile, in the delay generation circuit 402, the third clock signal 105 passes through the tiers in the generation delay line 420 until reaching the tier where the phases match. Therefore, the signal is delayed by the time obtained by multiplying the unit delay time (here, the time which is three times as long as the delay time of the delay elements 411 in the measurement delay line 419) by the number of the matching tiers. Further, since this signal passes through the convergence circuit 408 and the output buffer 108, the signal is delayed by the respective passing times, and then outputted as the fourth clock signal 106.

Incidentally, a relationship which is established in the above-described case between the time difference (Dtgt) between the first clock signal and the second clock signal and the time difference (Dgen) between the third clock signal and the fourth clock signal will be described below. The unit delay time in the measurement delay line 419 is defined as D1, the delay time in the convergence circuit 408 is defined as Dc, and the delay time in the output buffer 108 is defined as Do.

Figure 2:
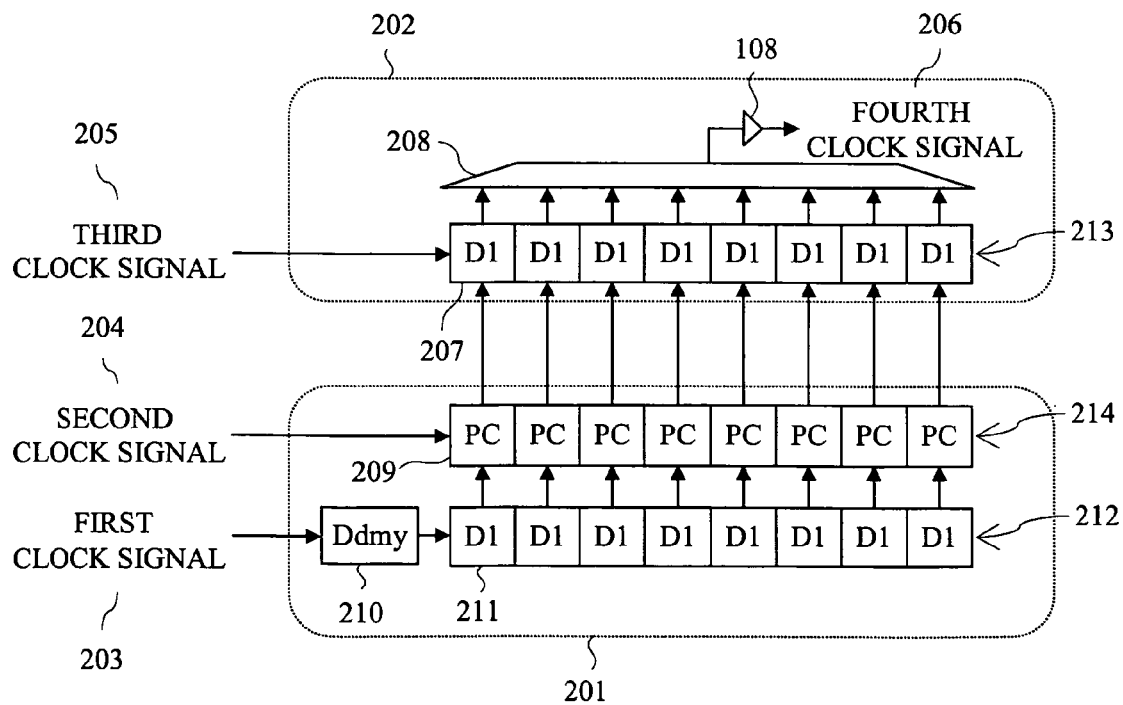
FIG. 2 is a block diagram illustrating a configuration of a phase synchronization circuit examined as a premise of the present invention.

The delay time (Ddmy) of the fixed delay element 210 for phase adjustment in the case of generating the same time shown in FIG. 2 is the sum of the time Dc and the time Do. That is to say, Ddmy=Dc+Do. Besides the delay times, when the third clock signal passes through a circuit where any additive delay is given to it in the delay generation circuit 202, the delay time in this circuit is also added. In this example, however, for easy understanding, the case of only the time Dc and the time Do will be described.

In FIG. 4A, the number of the tiers Sd until the phase matching tier in the measurement delay line 419 is obtained by the following equation (1).

$$Sd=(Dtgt-Ddmy/3)/D1=(Dtgt-(Dc+Do)/3)/D1 \quad \text{Equation (1)}$$

Meanwhile, the third clock signal is delayed by the time obtained by multiplying the unit delay time by this number of the tiers. When the delay time until the phase matching tier is defined as T1, T1 is obtained by the following equation (2).

$$T1=Sd\cdot 3\cdot D1=3\cdot(Dtgt-(Dc+Do)/3)=3\cdot Dtgt-(Dc+Do) \quad \text{Equation (2)}$$

Further, since this signal passes through the convergence circuit 408 and the output buffer 108, the total delay time Dgen is obtained by the following equation (3).

$$Dgen=T1+Dc+Do=3\cdot Dtgt \quad \text{Equation (3)}$$

As is clear from the equation (3), the time difference between the third clock signal and the fourth clock signal is three times as long as the time difference between the first clock signal and the second clock signal.

Similarly, also in the example of FIG. 4B, it is easily confirmed that the time difference between the third clock signal and the fourth clock signal is half of the time difference between the first clock signal and the second clock signal.

Figure 8:
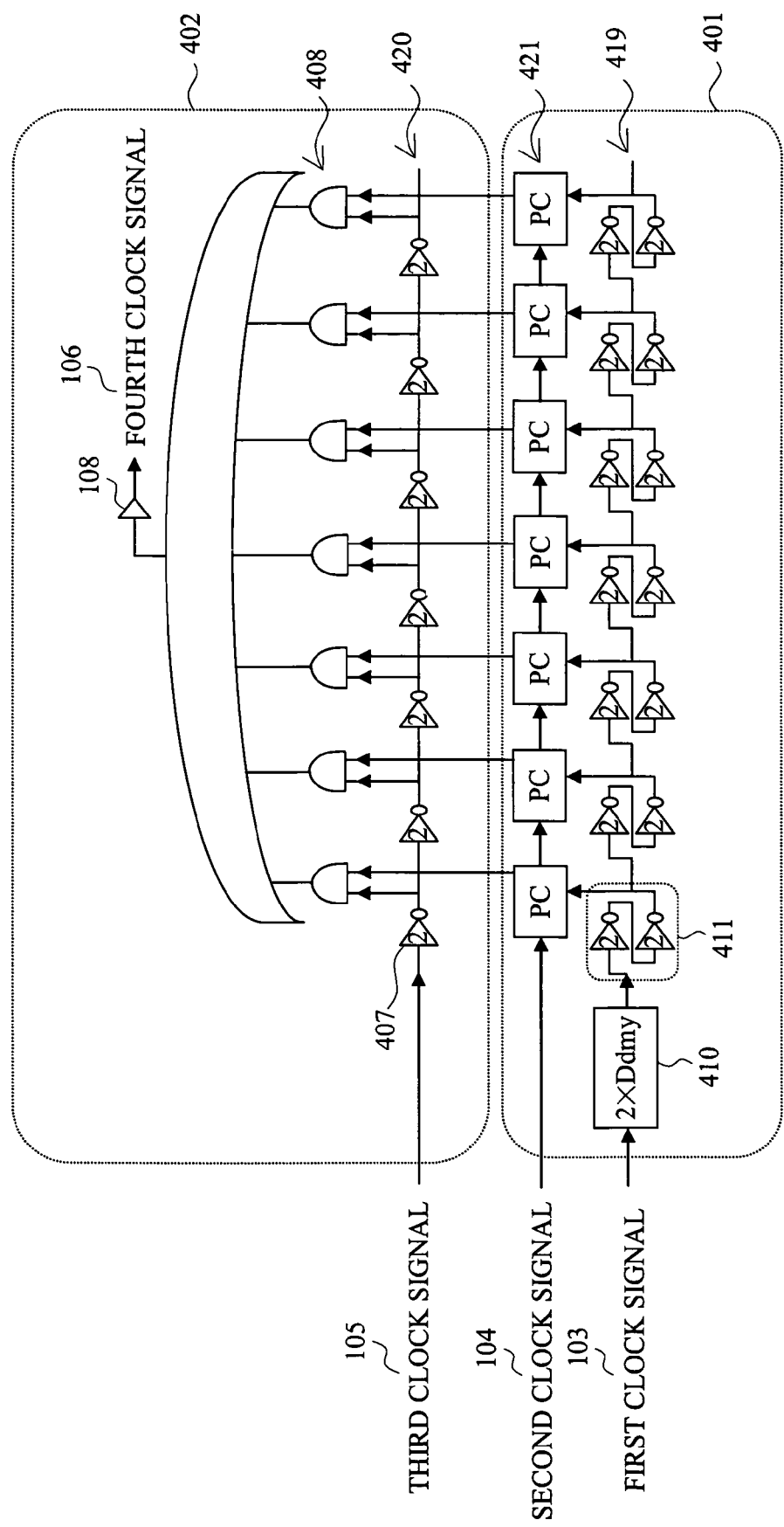
FIG. 8 is a circuit diagram illustrating a configuration example of the phase synchronization circuit according to the second embodiment of the present invention.

FIG. 8 is a circuit diagram illustrating a detailed configuration of the phase synchronization circuit according to the second embodiment. FIG. 8 illustrates an example of the circuit where, like the configuration shown in FIG. 4B, the third clock signal is delayed by the time difference which is not the same as the time difference between the first clock signal and the second clock signal but is in a relationship of ½ with the time difference between the two signals as the constant ratio relationship so as to output the fourth clock signal. In the measurement delay line 419 and the generation delay line 420, inverter delays are used as the unit delay circuit of the delay elements, but the unit delay circuit is not limited to this as mentioned above.

Here, in the measurement delay line 419, the delay time of the delay element 411 is equal to two tiers of the inverter delay. Meanwhile, in the generation delay line 420, the delay time of the delay element 407 is equal to one tier of the inverter delay. Further, the delay time of the fixed delay element 410 for phase adjustment is set so as to be the delay time which is twice the case where the time which is the same as the time difference between the first and the second clock signals is generated (2·Ddmy). Such a time can be obtained when the signal passes through the circuit shown in FIG. 7 twice.

Next, a relationship which is established between the time difference (Dtgt) between the first and second clock signals and the time difference (Dgen) between the third and fourth clock signals in the above-described case will be described below. The unit delay time of the inverter delay in the measurement delay line 419 is defined as D1, the delay time in the convergence circuit 408 is defined as Dc, and the delay time in the output buffer 108 is defined as Do. As described above, the delay time (Ddmy) of the fixed delay element 210 for phase adjustment in the case of genrating the same time shown in FIG. 2 is the sum of Dc and Do (namely, Ddmy=Dc+Do). First, the number of the tiers Sd until the phase matching tier in the measurement delay line is obtained by the following equation (4).

$$Sd=(Dtgt-2 \cdot Ddmy)/(2 \cdot D1)=(Dtgt-2 \cdot (Dc+Do))/(2 \cdot D1) \quad \text{Equation (4)}$$

Meanwhile, the third clock signal is delayed by the time obtained by multiplying the unit delay time D1 by the number of the tiers Sd. When the delay amount until the phase matching tier is defined as T1, T1 is obtained by the following equation (5).

$$T1=Sd \cdot D1=(Dtgt-2 \cdot (Dc+Do))/2=Dtgt/2-(DC+Do) \quad \text{Equation (5)}$$

Further, since this signal passes through the convergence circuit 408 and the output buffer 108, the total delay time Dgen of from the third clock signal to the fourth clock signal is obtained by the following equation (6).

$$Dgen=T1+Dc+Do=Dtgt/2 \quad \text{Equation (6)}$$

As is clear from the equation (6), it can be confirmed that the delay time to be generated is ½ (namely, half) of the time difference between the first and second clock signals.

Third Embodiment

Figure 9:
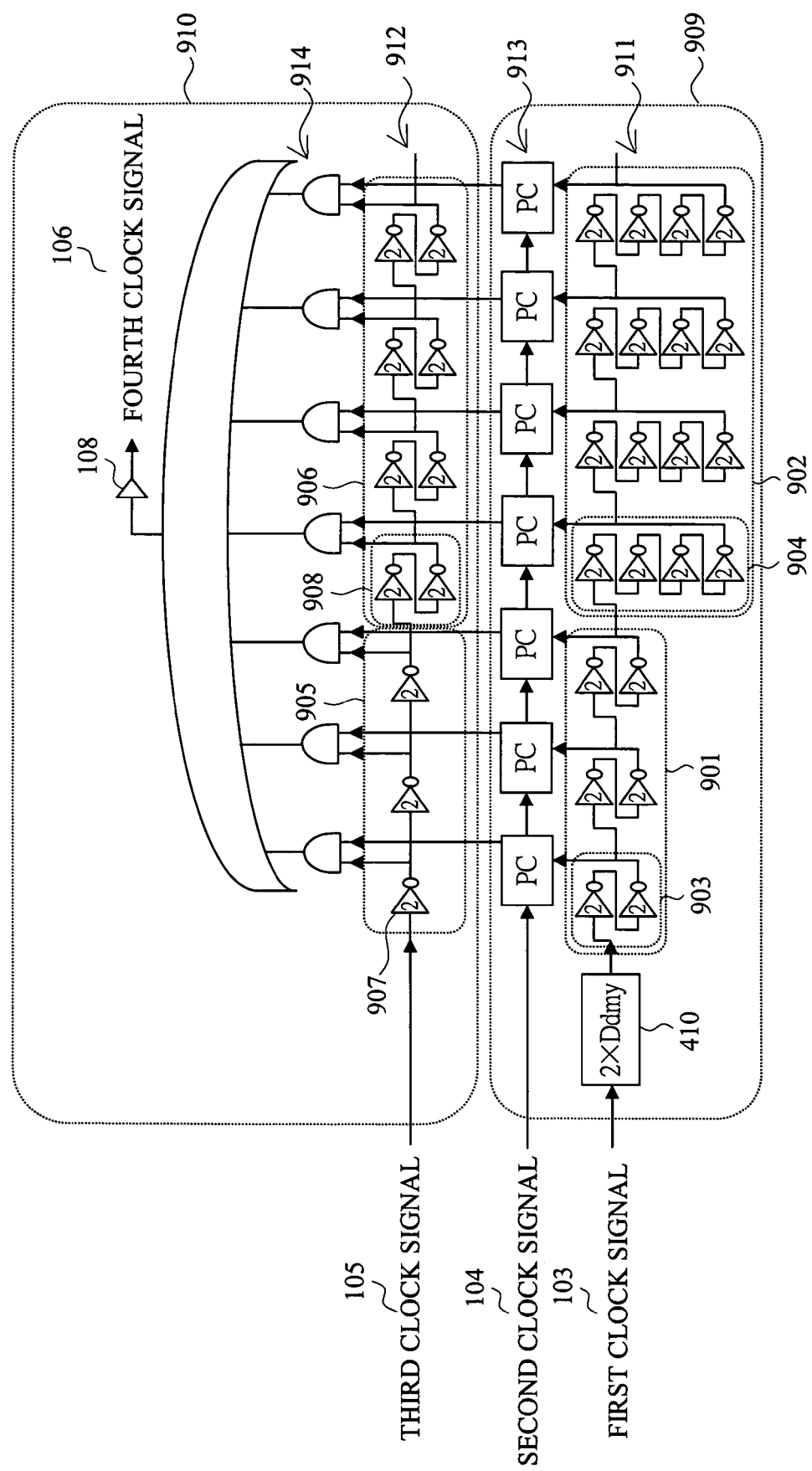
FIG. 9 is a circuit diagram illustrating a configuration example of the phase synchronization circuit according to a third embodiment of the present invention.

FIG. 9 is a circuit diagram illustrating a detailed configuration of the phase synchronization circuit according to the third embodiment of the present invention. The phase synchronization circuit according to the third embodiment is obtained by combining the first embodiment and the second embodiment. The third embodiment provides the phase synchronization circuit that generates time difference which is different from the time difference between the first and second clock signals from outside while reducing the number of delay tiers so as to improve the flexibility and reduce the circuit scale, the chip area and the electric power.

More specifically, in the measurement delay line 911 in the measurement circuit 909, the measurement delay tier 901 on the first tier side where the first clock signal 103 reaches earlier uses the delay element 903 composed of two tiers of the inverter delays. Meanwhile, the measurement delay tier 902 on the latter tier side where the first clock signal 103 reaches later uses the delay element 904 composed of four tiers of inverter delays.

Meanwhile, in the generation delay line 912 in the delay generation circuit 910, the generation delay tier 905 on the first tier side where the third clock signal 105 reaches earlier uses the delay element 907 composed of one tier of the inverter delay. Also, the generation delay tier 906 on the latter tier side where the third clock signal 105 reaches later uses the delay element 908 composed of two tiers of the inverter delays.

In such a configuration, the time which is half of the time difference between the first clock signal 103 and the second clock signal 104 from the outside is generated as the time difference between the third clock signal 105 and the fourth clock signal 106.

Figure 10:
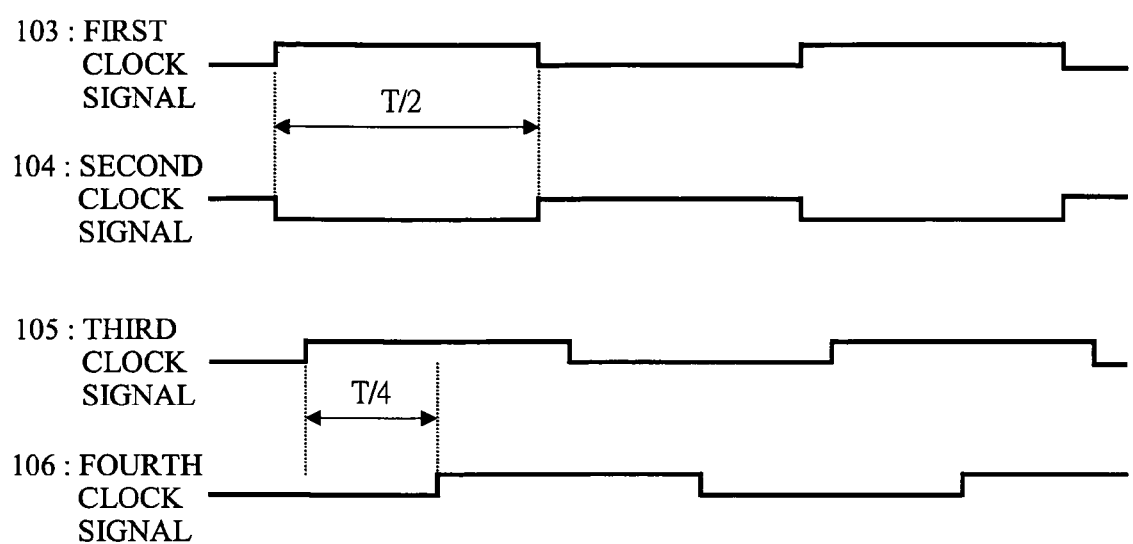
FIG. 10 is a diagram illustrating a timing relationship among clock signals of the phase synchronization circuit shown in FIG. 9 according to the third embodiment of the present invention.

FIG. 10 illustrates time charts in this case. In this configuration, the first clock signal 103 and the second clock signal 104 are inputted so as to have a phase difference of 180°, and the fourth clock signal 106 is outputted while delaying the phase of third clock signal 105 by 90°.

Fourth Embodiment

Figure 11:
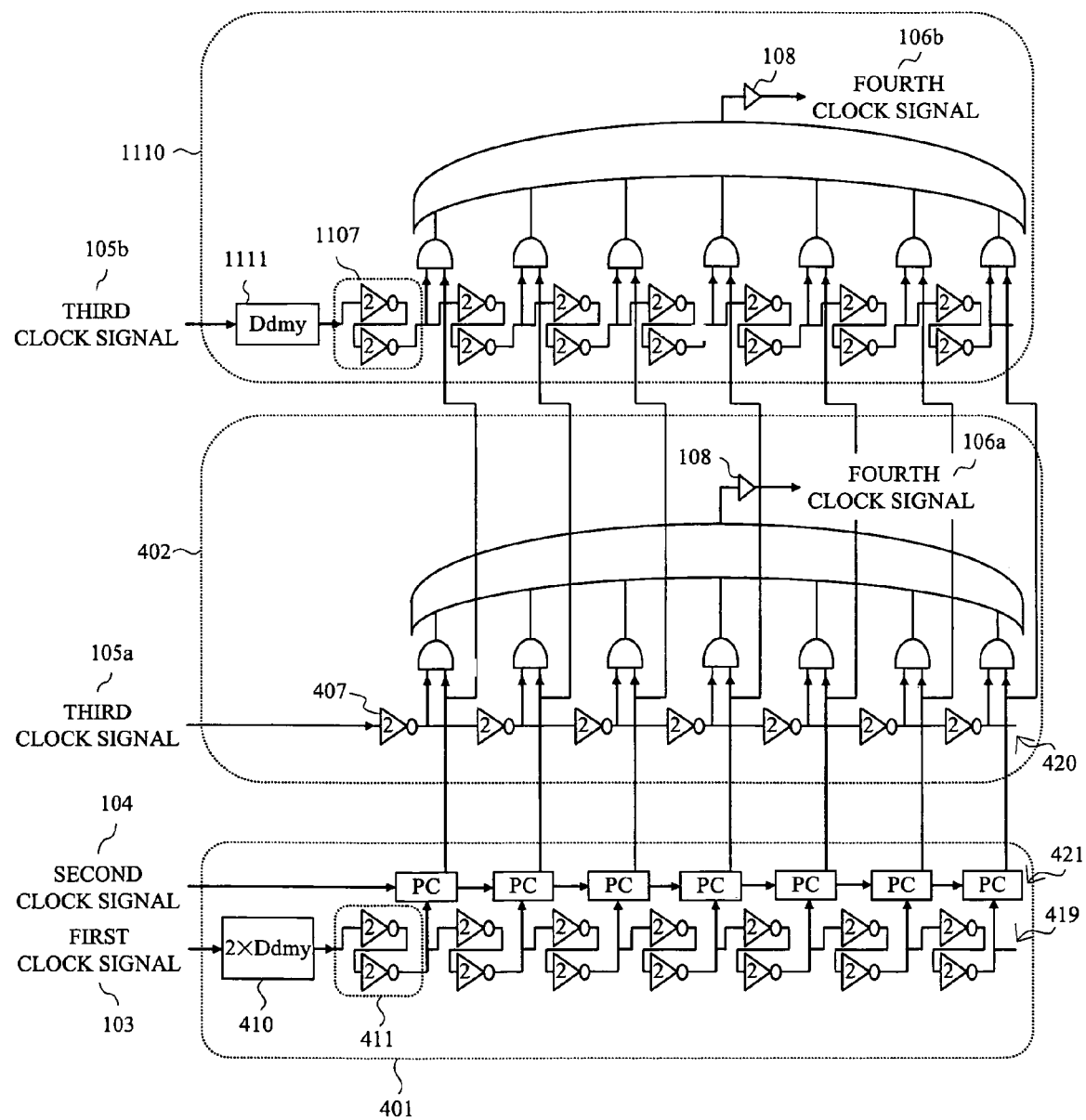
FIG. 11 is a circuit diagram illustrating a configuration example of the phase synchronization circuit according to a fourth embodiment of the present invention.

FIG. 11 is a circuit diagram illustrating a detailed configuration of the phase synchronization circuit according to the fourth embodiment of the present invention. In the phase synchronization circuit according to the fourth embodiment, a plurality of the generation circuits in the second embodiment are provided. The phase synchronization circuit shown in FIG. 11 is one example thereof, in which two third clock signals 105a and 105b are present and their inputs are delayed so that the two fourth clock signals 106a and 106b are outputted.

The delay times of the two fourth clock signals 106a and 106b may be the same, but they are different in this example. The delay generation circuit 402 generates delay time which is half of the time difference between the first clock signal 103 and the second clock signal 104 received by the measurement circuit 401, whereas the delay generation circuit 1110 generates a time difference which is the same as the time difference between the first and second clock signals on the measurement circuit 401 side.

For its achievement, when unit delay of the delay element 411 in the measurement circuit 401 is realized by two tiers of the inverter delays, the unit delay in the delay generation circuit 402 is composed of the delay element 407 which is one tier of the inverter delay. Further, the unit delay in the delay generation circuit 1110 is composed of the delay element 1107 which is two tiers of the inverter delays. Also, in the delay generation circuit 1110, the fixed delay element 1111 having the delay time which is half of that in the measurement circuit 401 is used as the fixed delay element for phase adjustment.

Since the measurement circuit is used in common in the configuration of the fourth embodiment, the occupying area on the chip and the electric power to be used can be reduced in comparison to those in the case where two different phase synchronization circuits are used.

Figure 12:
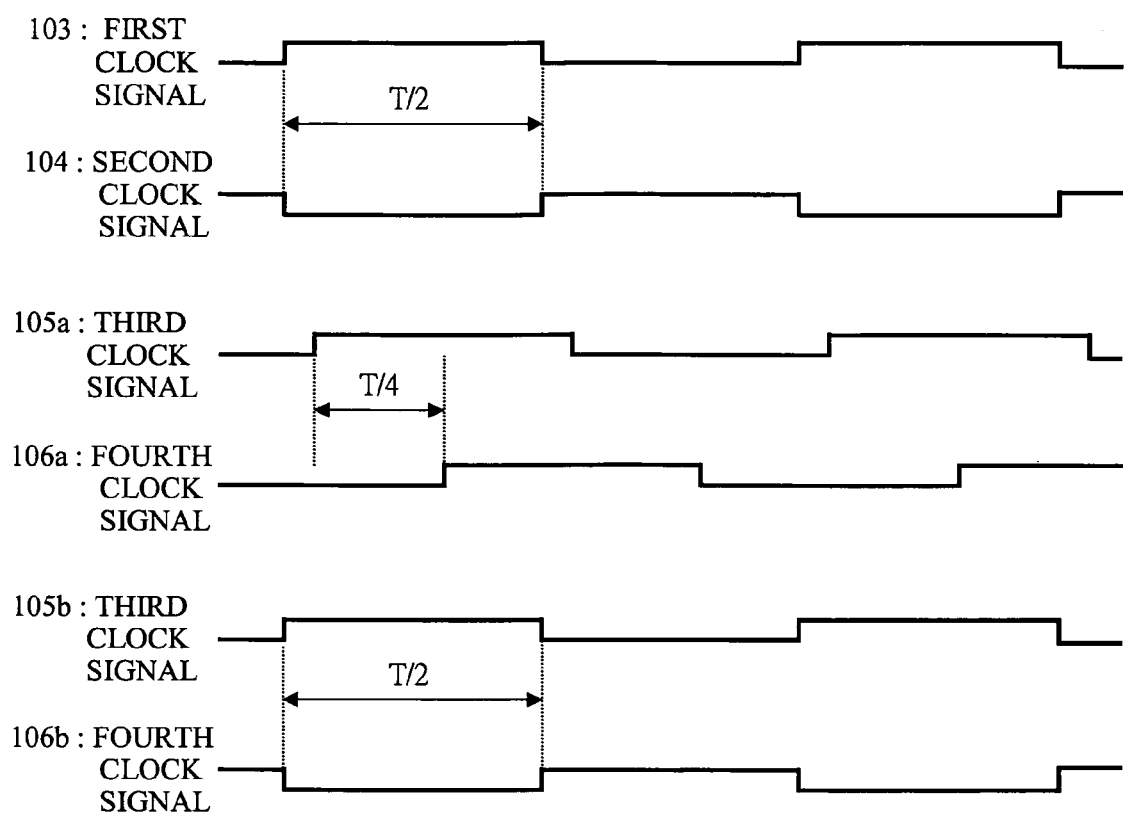
FIG. 12 is a diagram illustrating a timing relationship among clock signals of the phase synchronization circuit shown in FIG. 11 according to the fourth embodiment of the present invention.

FIG. 12 is a time chart illustrating a relationship among the clock signals in the phase synchronization circuit shown in FIG. 11.

In the phase synchronization circuit shown in FIG. 11, the number of the delay lines of the measurement circuit 401, the delay generation circuit 402 and the delay generation circuit 1110 are one, but they can be composed of a plurality of delay elements having different unit delay times. When the configurations in the first to third embodiments are combined and a plurality of generation circuits are present, for example, the number thereof is not limited to two and may be three or more.

Figure 13:
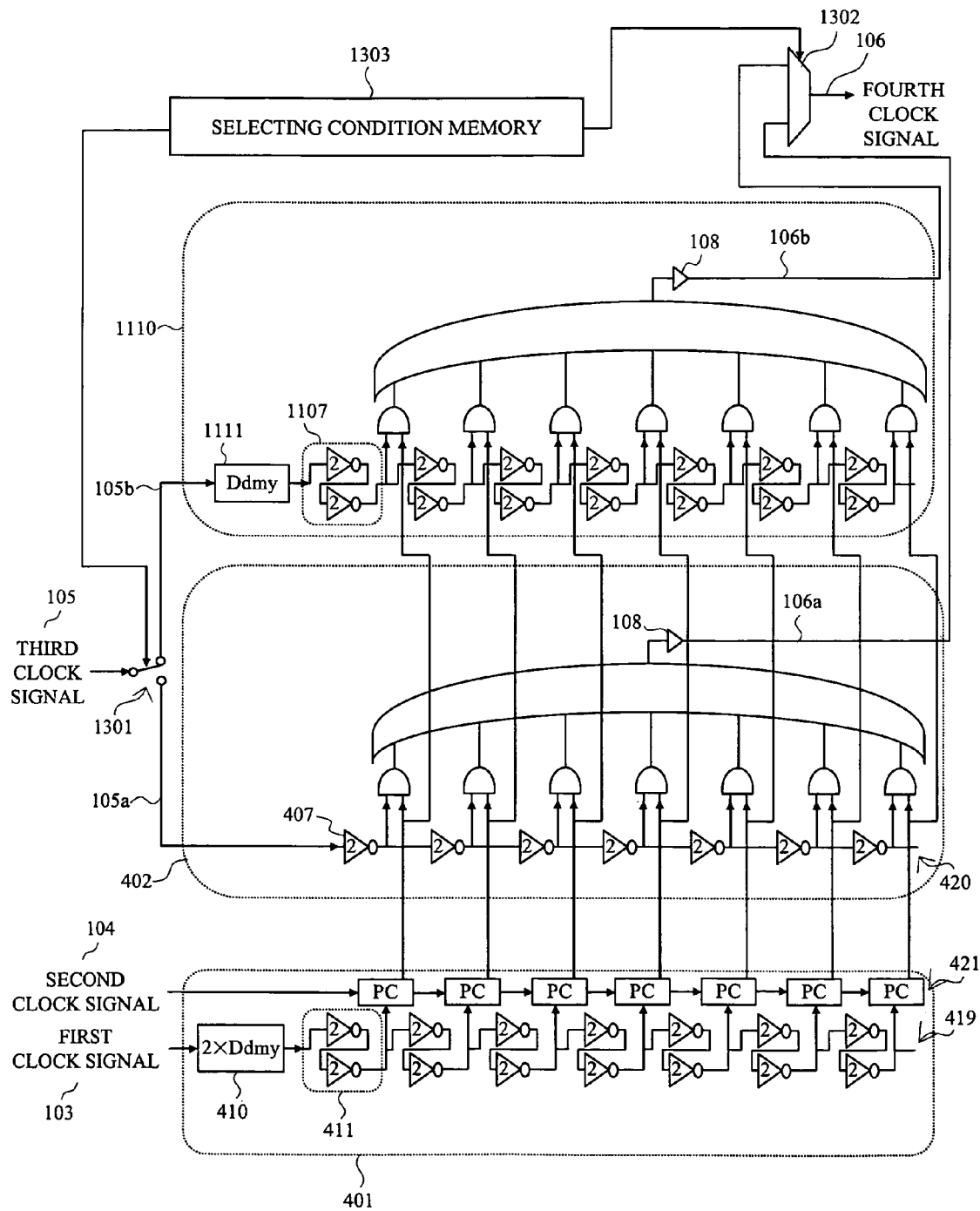
FIG. 13 is a circuit diagram illustrating another configuration example of the phase synchronization circuit according to the fourth embodiment of the present invention.

FIG. 13 is a circuit diagram illustrating another phase synchronization circuit according to the fourth embodiment. FIG. 13 illustrates a selection-type phase synchronization circuit in which two different phase differences can be selectively generated by using the phase synchronization circuit shown in FIG. 11. For this reason, in the phase synchronization circuit shown in FIG. 13, a switch 1301 that selects the third clock signal 105a or 105b, a selector 1302 that selects the fourth clock signal 106a or 106b, and a selecting condition memory 1303 that sets a selecting conditions are added to the phase synchronization circuit shown in FIG. 11.

Such a circuit is useful for the case where a necessary phase difference changes depending on the time of use. For example, at the time of reading from a memory such as SDRAM (Synchronous Dynamic Random Access Memory) with single data rate, since data change timing is once in one clock cycle, the phase difference of 180° is selectively used. Alternatively, at the time of reading from a memory such as SDRAM with double data rate, since the data change timing is twice in one clock cycle, the phase difference of 90° is selectively used. The selection thereof may be performed by the direct driving by an external control signal, or may be dynamically performed by retaining a phase difference in the selecting condition memory 1303 such as a setting register and switching this value at the time of use.

Also in this embodiment, similar to the example shown in FIG. 11, since the measurement circuit 401 is used in common, the occupying area on the chip and the electric power can be reduced in comparison to the case where two different phase synchronization circuits are used.

Fifth Embodiment

Figure 14:
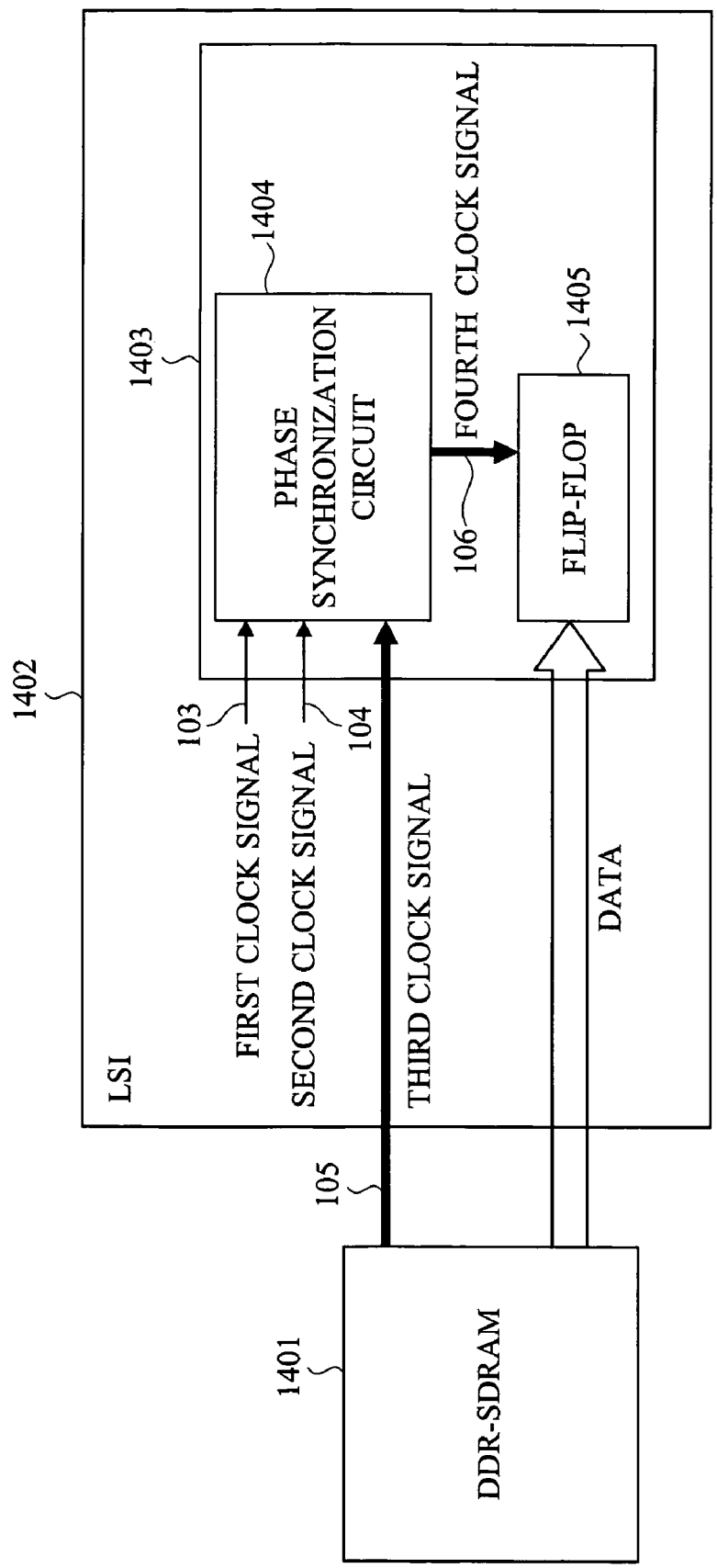
FIG. 14 is a block diagram illustrating a configuration example of a system to which the phase synchronization circuit of the present invention is applied according to a fifth embodiment of the present invention.

FIG. 14 is a block diagram illustrating a connection relationship between DDR-SDRAM (Double Data Rate-SDRAM) 1401 and LSI (Large Scale Integrated Circuit) 1402 as one application example of the phase synchronization circuit according to the first to fourth embodiments.

The LSI 1402 is mounted with a memory interface 1403 including the phase synchronization circuit 1404 according to the first to fourth embodiments and the flip-flop 1405. The phase synchronization circuit 1404 controls a phase at the time when the data is read from the DDR-SDRAM. The third clock signal is inputted from the DDR-SDRAM 1401 into the phase synchronization circuit 1404, and a data signal is inputted into the flip-flop 1405. Also, the first clock signal and the second clock signal are inputted into the phase synchronization circuit 1404, and the fourth clock signal is outputted to the flip-flop 1405. When the phase synchronization circuit according to the first to fourth embodiments is used as the phase synchronization circuit 1404, the LSI 1402 can securely read data from the DDR-SDRAM 1401 with low electric power at accurate timing. Further, the occupying area of the phase synchronization circuit 1404 on the chip is small.

Figure 15:
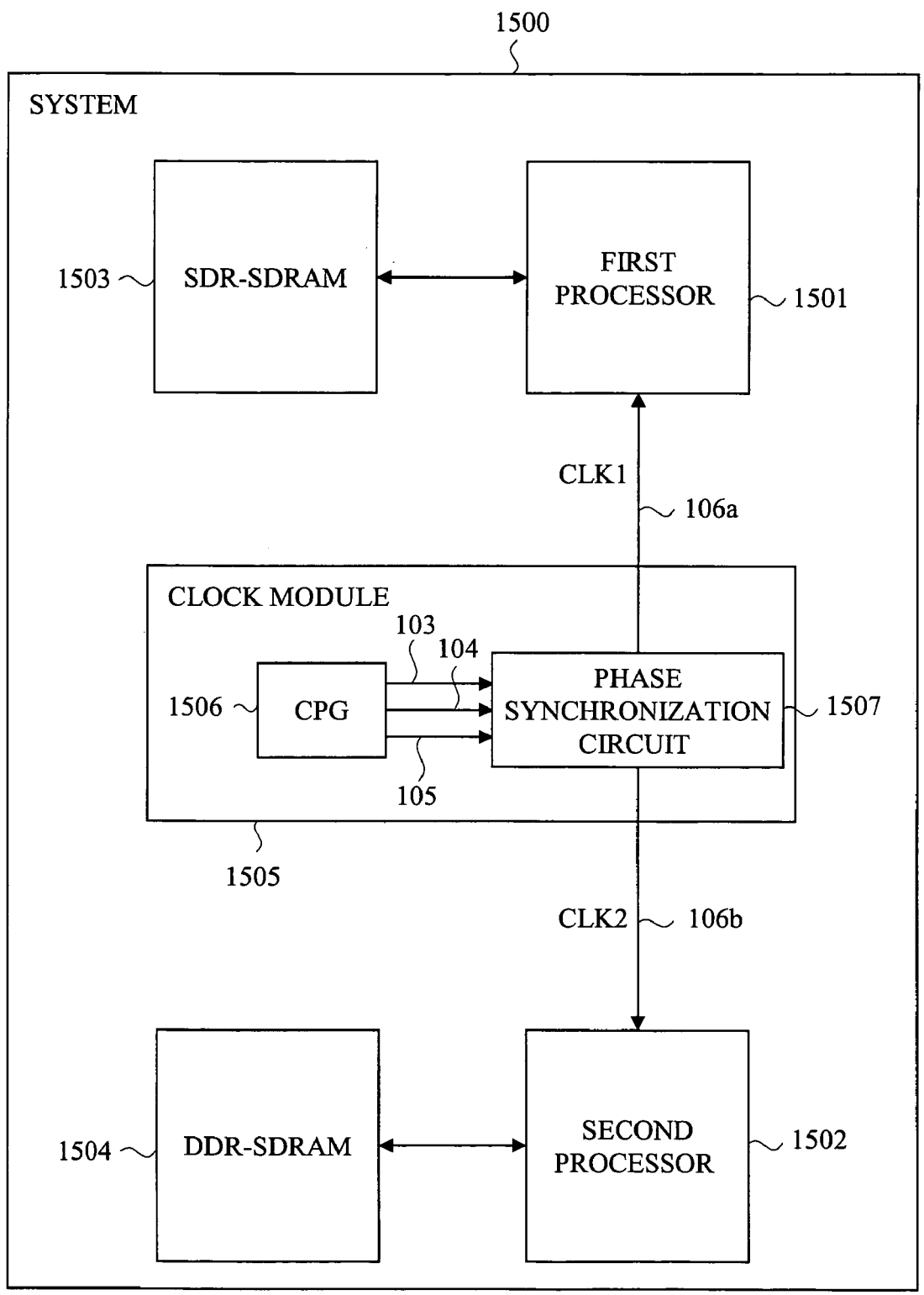
FIG. 15 is a block diagram illustrating another configuration example of the system to which the phase synchronization circuit of the present invention is applied according to the fifth embodiment of the present invention.

FIG. 15 is a block diagram illustrating an example where synchronization is taken in a system 1500 in which a plurality of processors (so-called multiprocessors) are connected by using the phase synchronization circuit according to the first to fourth embodiments. The system 1500 is composed of a first processor 1501, a second processor 1502, an SDR-SDRAM (Single Data Rate-SDRAM) 1503, a DDR-SDRAM 1504, a clock module 1505 and the like.

The clock module 1505 is composed of a clock generation circuit (CPG) 1506, the phase synchronization circuit 1507 according to the first to fourth embodiments, and the like. The SDR-SDRAM 1503 and the first processor 1501 are connected, and the DDR-SDRAM 1504 and the second processor 1502 are connected. Also, the first clock signal 103, the second clock signal 104 and the third clock signal 105 are inputted from the clock generation circuit 1506 to the phase synchronization circuit 1507, the fourth clock signal 106a is outputted to the first processor 1501, and the fourth clock signal 106b is outputted to the second processor 1502.

The first and second processors 1501 and 1502 may be formed on separate semiconductor chips or on one chip. Such a connection is necessary in the case where the processors with different clock synchronization timings are to be connected. In the example shown in FIG. 15, the first processor 1501 operates in synchronization with the SDR-SDRAM 1503 of single data rate, and the second processor 1502 operates in synchronization with the DDR-SDRAM 1504 of double data rate.

The reading from the SDR-SDRAM 1503 is carried out in synchronization with the timing where the phase is shifted by 180° from the clock signal, and on the contrary, the reading from the DDR-SDRAM 1504 is carried out in synchronization with the timing where the phase is shifted by 90°.

When the first and second processor 1501 and 1502 operate in a state where the phases are shifted by 90°, the clock module 1505 including the phase synchronization circuit 1507 according to the fourth embodiment and the clock generation circuit 1506 that generates the first clock signal 103, the second clock signal 104 and the third clock signal 105 which are the sources of the fourth clock signals can supply the fourth clock signals 106a and 106b with different phases to both the processors, respectively. The first and second processors 1501 and 1502, and the clock module 1505 in FIG. 15 may be disposed on one chip, and the clock module 1505 may be mounted to one of the processors. The phase synchronization circuit according to the fourth embodiment can be widely used for the connection between the processors having different clock synchronization timings other than the example described above.

Sixth Embodiment

Figure 16:
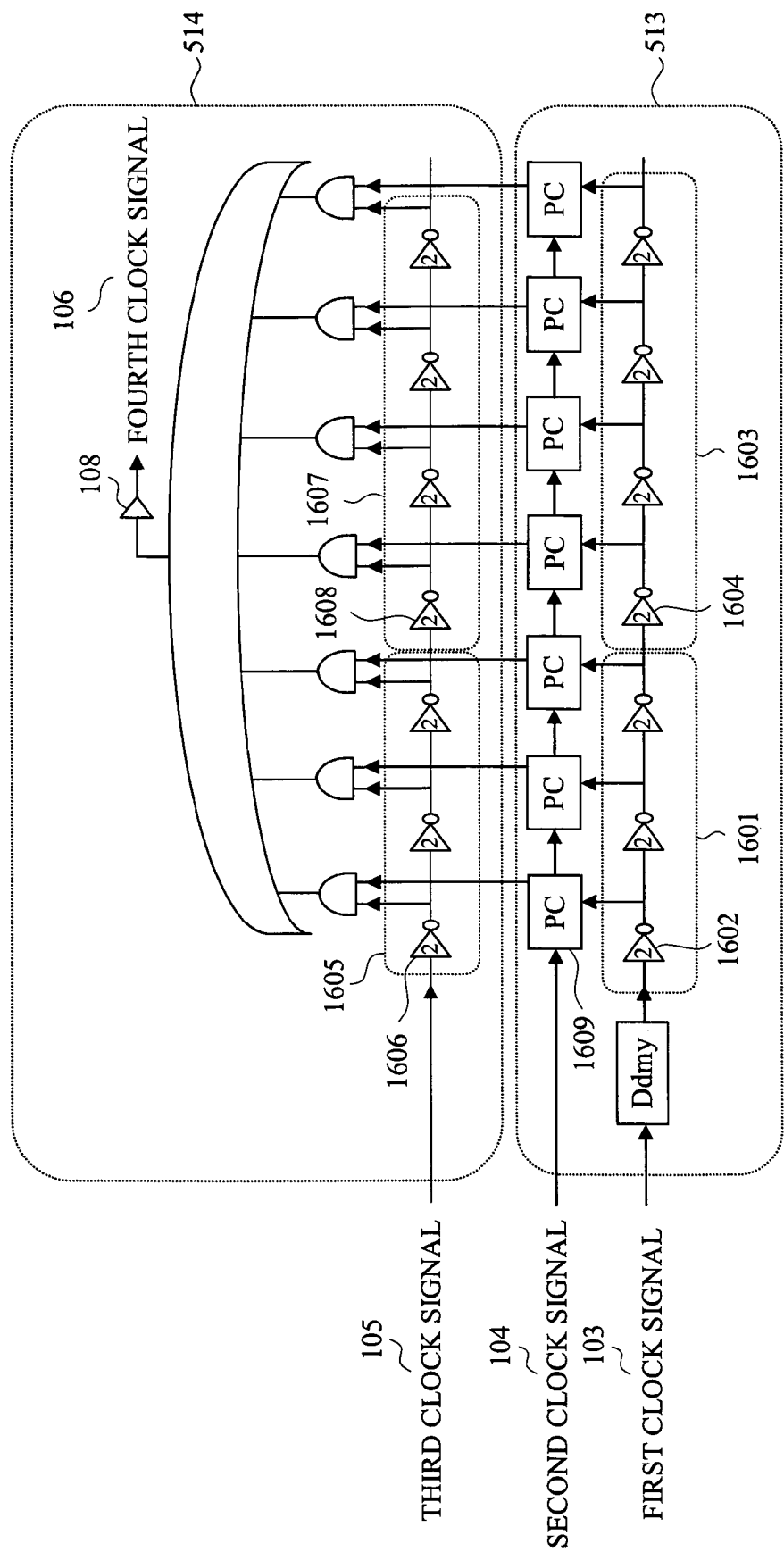
FIG. 16 is a circuit diagram illustrating a configuration example of the phase synchronization circuit according to a sixth embodiment of the present invention.

FIG. 16 is a diagram illustrating one example of a method of differentiating the delay times of the delay elements at a plurality of delay tiers in the phase synchronization circuit according to the first embodiment. In the example of the phase synchronization circuit shown in FIG. 5, the number of cascade connections of the inverter delays is changed so as to constitute the delay elements having different unit delay times. Besides the method of changing the number of cascade connections of gates with the same logic, however, a method in which the type of the gates is changed in the plural delay elements (an inverter gate is used in a certain delay element, and a multi-input NAND gate is used in the other delay line) is also possible.

In the phase synchronization circuit according to the sixth embodiment shown in FIG. 16, the delay times of the delay elements are set not by the number of cascade connections of the inverter delays but by the plural types of the inverter delays having different delay times. For example, the inverter delays 1602 and 1606 are different from the inverter delays 1604 and 1608 in the delay time. More specifically, in the embodiment shown in FIG. 16, the delay tiers 1601 and 1605 where the unit delay time is short use the inverter delays 1602 and 1606 where two tiers of the inverter gates which can be operated at high speed by transistors with a low threshold voltage are connected. On the other hand, the measurement delay tiers 1603 and 1607 where the unit delay time is long use the inverter delays 1604 and 1608 where two tiers of the inverter gates which are operated at low speed by devices with a high threshold voltage are connected.

In such a manner, it is possible to constitute a plurality of delay lines by using the plural types of the basic devices. In general, it is known that a leakage current is high in a standby state (non-operation state) in the device using the transistor with low threshold voltage. As shown in the sixth embodiment, since such a device is applied only to the delay tiers 1601 and 1605 which are required for the high-speed operation in the plural delay elements, the low-threshold device is used only for a few gates. For this reason, the phase synchronization circuit can be operated at high speed, whereas the leakage current in a standby state is not increased when viewed in total, and thus this contributes to the reduction in the electric power on the chip.

Figure 17A:
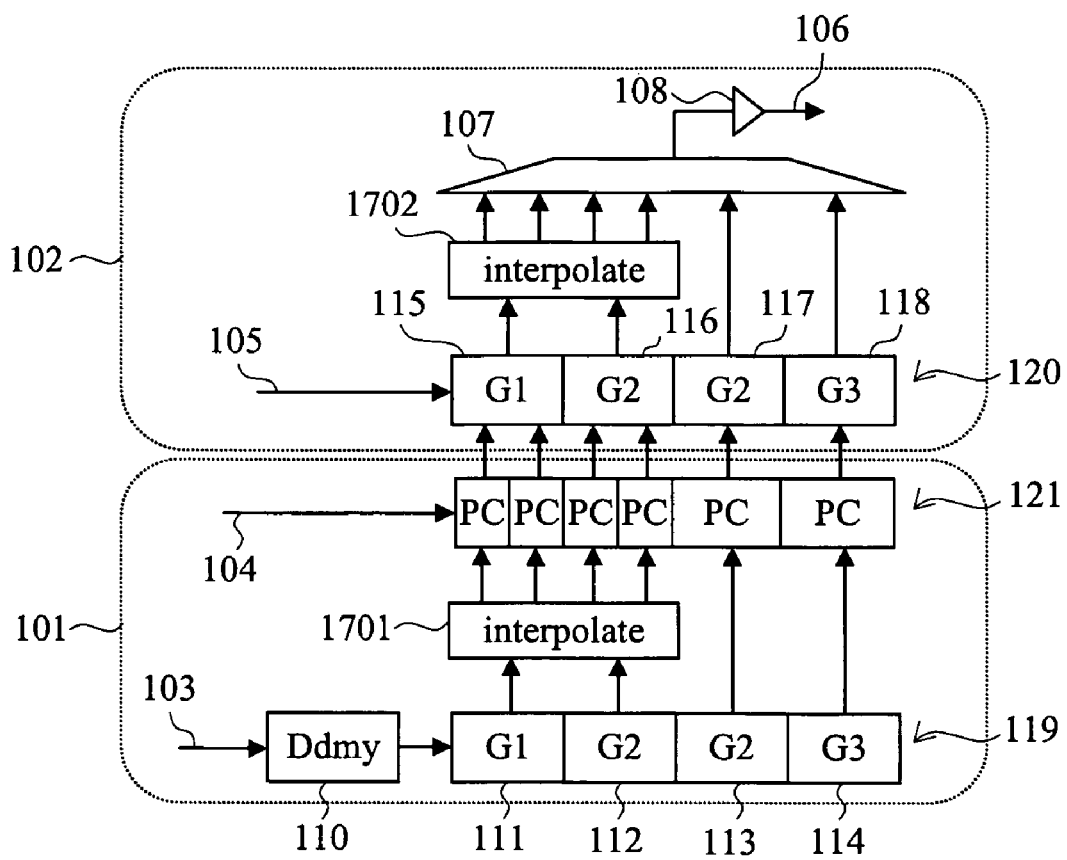
FIG. 17A is a circuit diagram illustrating another configuration example of the phase synchronization circuit according to the sixth embodiment of the present invention.
Figure 17B:
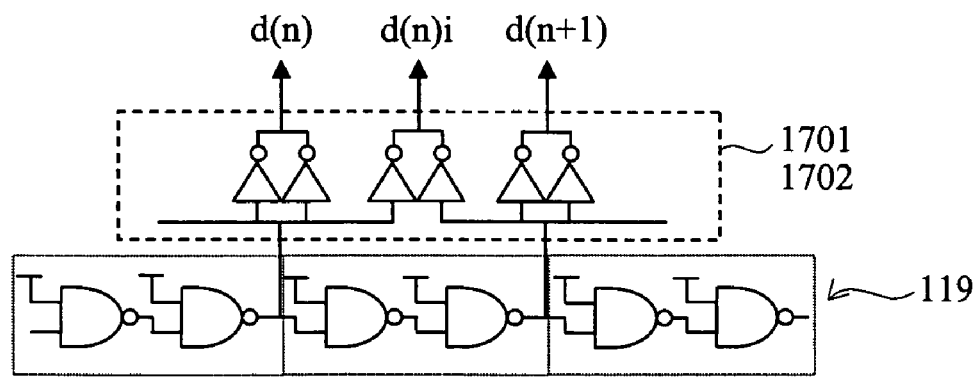
FIG. 17B is a circuit diagram illustrating another configuration example of the phase synchronization circuit according to the sixth embodiment of the present invention.

FIG. 17A and FIG. 17B are diagrams illustrating examples of another method of differentiating the delay times of the delay elements at a plurality of delay tiers in the phase synchronization circuit according to the first embodiment. More specifically, the phase synchronization circuit shown in FIG. 17A is an example where interpolators 1701 and 1702 are used as the method using smaller unit delay. The interpolator is a circuit which receives outputs from two delay tiers whose output times are different as inputs and generates the time therebetween. FIG. 17B is a diagram illustrating one example of such an interpolator.

Seventh Embodiment

Figure 18:
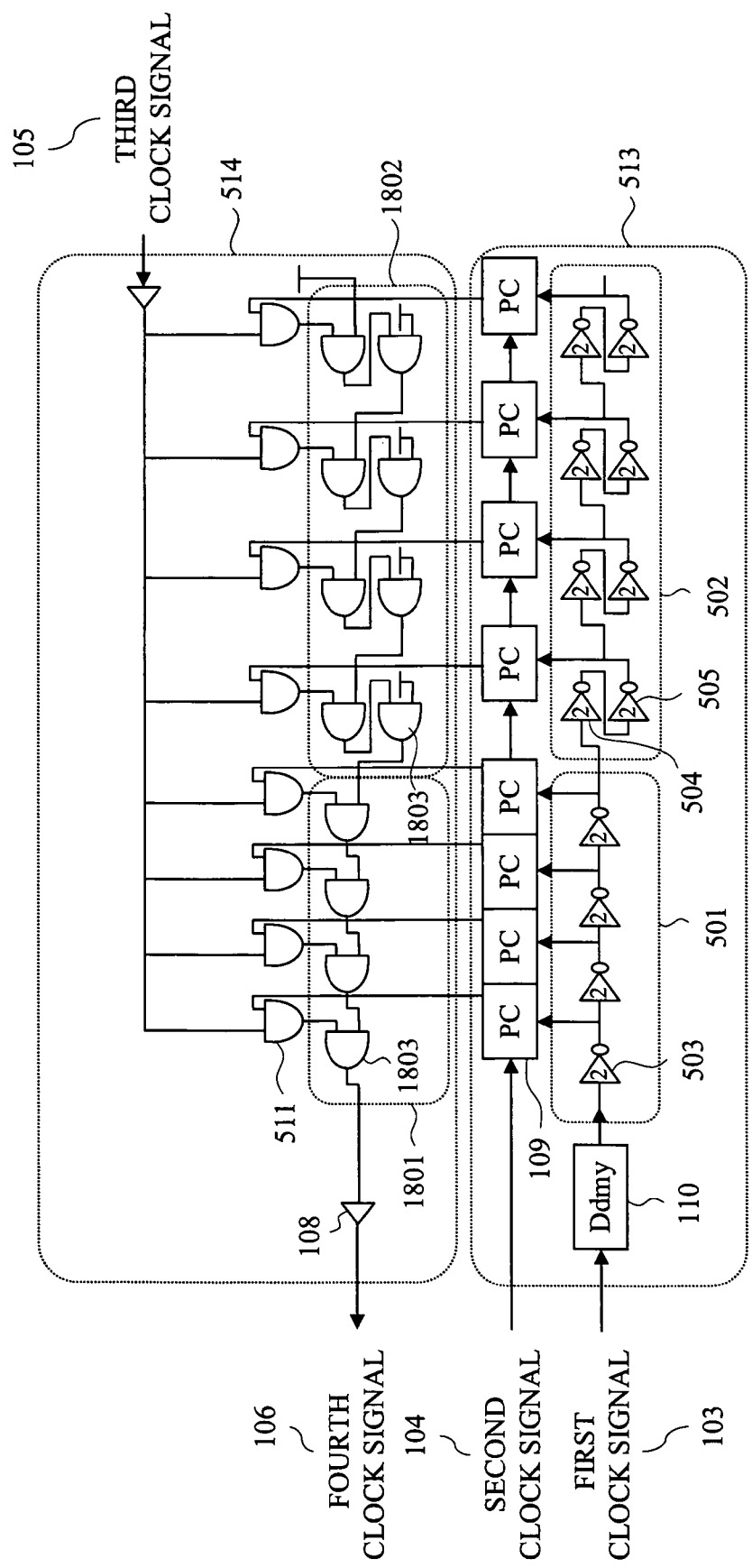
FIG. 18 is a circuit diagram illustrating a configuration example of the phase synchronization circuit according to a seventh embodiment of the present invention.

FIG. 18 is a circuit diagram illustrating a configuration of the phase synchronization circuit according to the seventh embodiment of the present invention. The phase synchronization circuit according to the seventh embodiment is one example where the first embodiment (FIG. 5) and the second embodiment are combined, and the first and second clock signals and the third clock signal advance in opposite directions with respect to the arranged direction of the delay lines. In order to change the delay time of the plural delay elements in the measurement delay line and the generation delay line, the number of the cascade connections of the delay elements in the respective delay lines is changed. For example in FIG. 18, in the measurement delay line, the delay element in the delay tier 501 is composed of one tier of the inverter delay 503, and the delay element in the delay tier 502 is composed of the two tiers of the inverter delays 504 and 505. Also, in the generation delay line, the delay element in the delay tier 1801 is composed of one tier of the AND gate 1803, and the delay element in the delay tier 1802 is composed of two tiers of the AND gates 1803. In order to realize a constant ratio of the delay time of the delay elements in the measurement delay line to delay time of the delay elements in the generation delay line, the type of the logic gates (inverter delay and OR gate) is changed.

Incidentally, the configuration in FIG. 18 is in contrast to the circuit configurations in FIG. 1 to FIG. 5, FIG. 8 and FIG. 9, FIG. 11, FIG. 13, FIG. 16 and FIG. 17 where the first clock signal, the second clock signal and the third clock signal advance in the same direction with respect to the arranged direction of the delay lines. In the examples of FIG. 1 to FIG. 17, after the third clock signal passes through the delay tiers until reaching the phase matching tier, it is determined whether this signal passes through the convergence circuit. On the contrary, in the configuration in FIG. 18, after the third clock signal 105 is once branched into the number equivalent to the number of the delay tiers, it is determined which branched signal is inserted into the delay tiers by using an output from the phase comparators. The circuits in the examples of FIG. 1 to FIG. 17 can be applied to the form where the signals advance in the opposite directions.

Eighth Embodiment

Figure 19A:
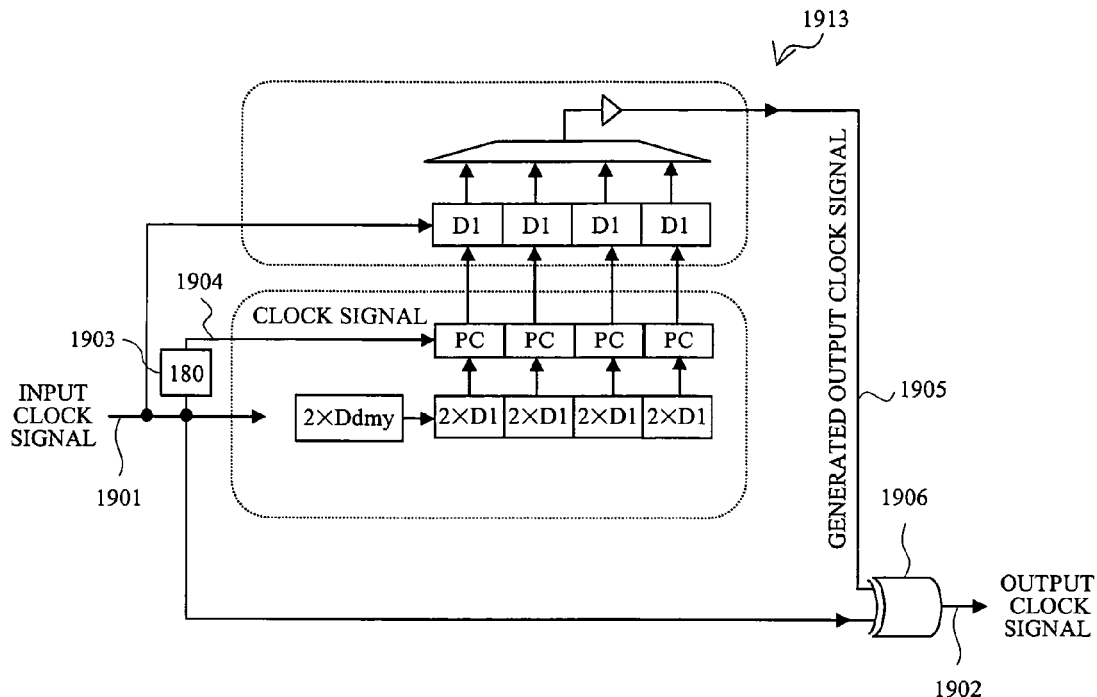
FIG. 19A is a circuit diagram illustrating a configuration example of a frequency-doubler circuit to which the phase synchronization circuit of the present invention is applied according to an eighth embodiment of the present invention.
Figure 19B:
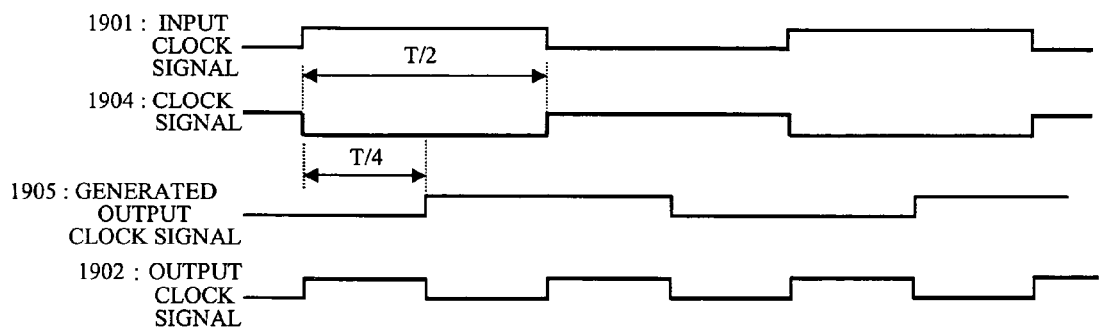
FIG. 19B is a diagram illustrating an operation of the frequency-doubler circuit shown in FIG. 19A.
Figure 19C:
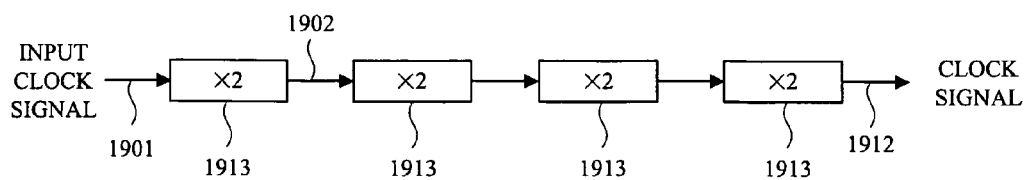
FIG. 19C is a diagram illustrating a configuration example of a frequency n-th power of 2 multiplier circuit to which the frequency-doubler circuit shown in FIG. 19A is applied.

FIG. 19A is a circuit diagram illustrating a configuration of the frequency-doubler circuit, FIG. 19B is a timing chart illustrating its operation, and FIG. 19C is a block diagram illustrating the configuration of a circuit in which the frequency is multiplied by the n-th power of 2 (n-th power of 2 multiplier circuit) in the eighth embodiment. Note that n is a natural number.

The frequency-doubler circuit and the n-th power of 2 multiplier circuit according to the eighth embodiment utilize the phase synchronization circuit according to the second embodiment. In the frequency-doubler circuit 1913 shown in FIG. 19A, for example, a phase conversion circuit 1903 that shifts a phase by 180° and an exclusive OR gate 1906 are added to the phase synchronization circuit shown in FIG. 4B. An input clock signal 1901 is used as the first clock signal 103 and the third clock signal 105, and a clock signal 1904 whose phase is shifted by 180° in the phase conversion circuit 1903 is inputted as the second clock signal 104. Also, the fourth clock signal 106 (generated output clock signal 1905) is used as one input signal to the exclusive OR gate 1906, an input clock signal 1901 is used as the other input signal to the exclusive OR gate 1906, and an output signal from the exclusive OR gate 1906 is used as an output clock signal 1902. Note that the phase conversion circuit 1903 can be created by an inverter gate or the like.

With reference to FIG. 19A and FIG. 19B, the operation of the frequency-doubler circuit 1913 will be described below. First, the phase conversion circuit 1903 generates a clock signal 1904 whose phase is shifted by 180° from the input clock signal 1901. Next, these signals are inputted into the phase synchronization circuit according to the second embodiment (for example, the circuit in FIG. 4) so as to create a generated output clock signal 1095 with a phase difference of 90° from the input clock signal 1901. Thereafter, an exclusive OR 1906 between the input clock signal 1901 and the generated output clock signal 1905 is obtained logically. By doing so, a clock with a doubled frequency can be created.

FIG. 19C illustrates an example where the frequency of the input clock signal 1901 is doubled by the frequency-doubler circuit 1913 in FIG. 19A, and the input clock signal 1901 is allowed to pass through the frequency-doubler circuit 1913 plural times (three times in FIG. 19C) so that a clock signal 1912 whose frequency is obtained by multiplying the original frequency by n-th power of 2 (16 times in FIG. 19C) can be generated. In general, by repeatedly providing the similar circuit configuration, the frequency n-th power of 2 multiplier circuit can be formed.

Figure 21A:
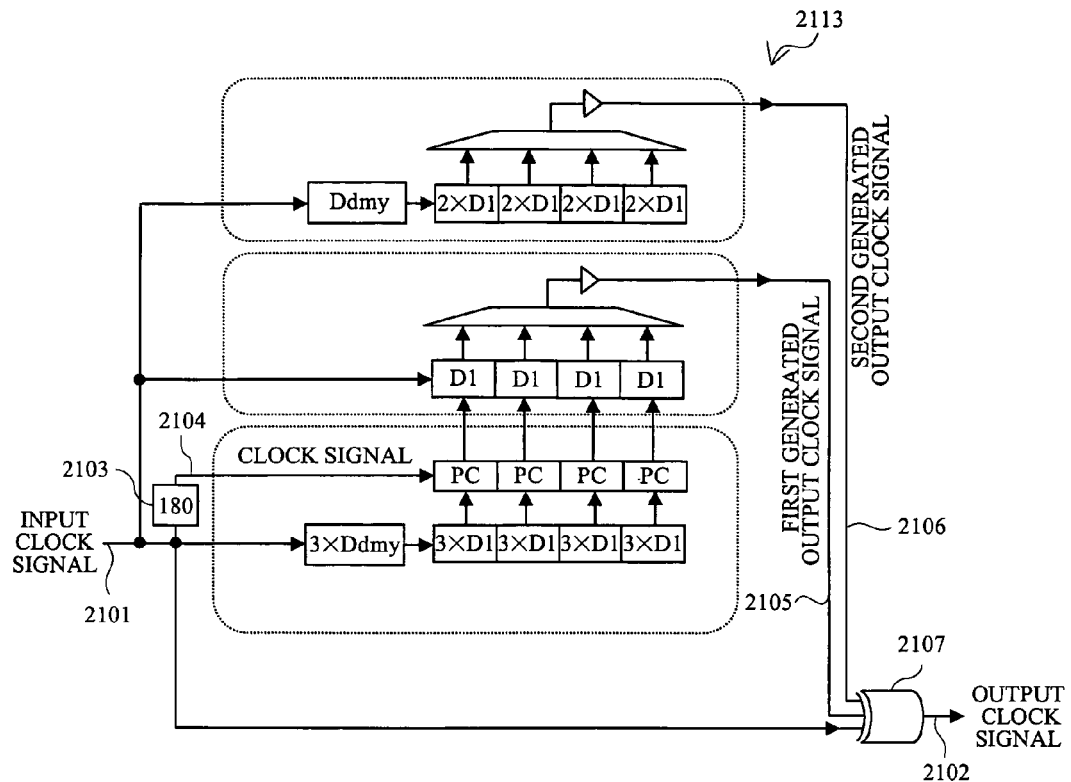
FIG. 21A is a circuit diagram illustrating a configuration example of a frequency-tripler circuit to which the phase synchronization circuit of the present invention is applied according to the eighth embodiment of the present invention.
Figure 21B:
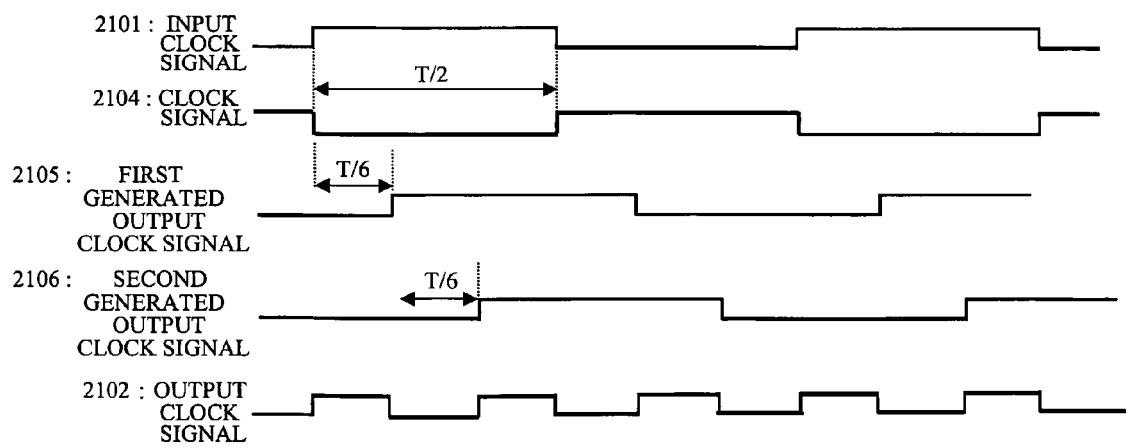
FIG. 21B is a diagram illustrating an operation of the frequency tripler circuit shown in FIG. 21A.
Figure 21C:
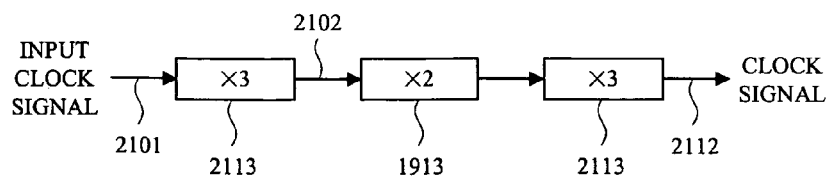
FIG. 21C is a diagram illustrating a configuration example of a frequency m-multiplier circuit to which the frequency tripler circuit shown in FIG. 21A and the frequency-doubler circuit shown in FIG. 19A are applied.

Further, FIG. 21A to FIG. 21C illustrate an example where the second invention can be utilized for not only the case of doubling the frequency but also the case where it is multiplied by m. Note that m is a natural number. In this case, m is 3 and a signal with a tripled frequency is generated. First, the phase conversion circuit 2103 generates a clock signal 2104 whose phase is shifted by 180° from an input clock signal 2101 (this can be generated by the inverter gate or the like). Next, these signals are inputted into the phase synchronization circuit according to the second embodiment so as to generate a first generated output clock signal 2105 whose phase is shifted by 60° from the input clock signal 2101 and a second generated output clock signal 2106 whose phase is shifted by 120° from the input clock signal. Thereafter, an exclusive OR gate 2107 among the input clock signal 2101, the first generated output clock signal 2105 and the second generated output clock signal 2106 is obtained logically. By doing so, a clock signal 2102 with tripled frequency can be generated.

FIG. 21B illustrates a state where the frequency is tripled as a time chart.

FIG. 21C illustrates an example where the frequency of the input clock signal 2101 is tripled by a frequency tripler circuit 2113 in FIG. 21A, this signal is allowed to pass through the frequency doubler circuit 1913 in FIG. 19A and again allowed to pass through the frequency tripler circuit 2113 in FIG. 21A, thereby generating a clock signal 2112 whose frequency is 18 times as high as original one. In the same manner, after circuits of 36° delay, 72° delay, 108° delay and 144° delay are created, by obtaining exclusive OR of five signals including their outputs and an input clock signal, a clock with quintuple frequency can be generated efficiently from the phase synchronization circuit according to the second embodiment used in common with such a measurement circuit. In the similar method, various frequencies can be generated.

Figure 20:
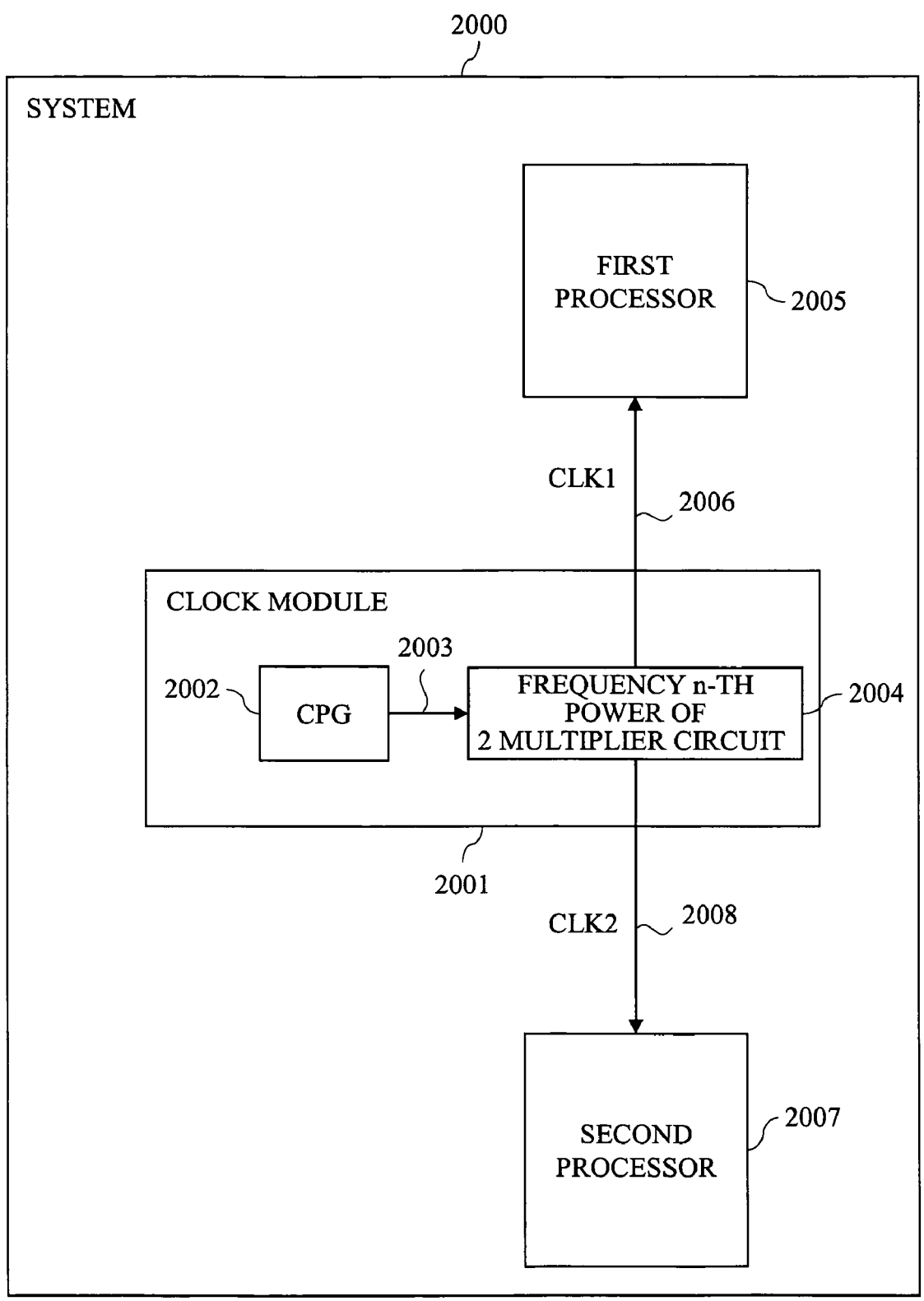
FIG. 20 is a block diagram illustrating a configuration example of the system to which the frequency-doubler circuit and the frequency n-th power of 2 multiplier circuit shown in FIG. 19 are applied according to the eighth embodiment of the present invention.

FIG. 20 illustrates the case where the circuit in the eighth embodiment shown in FIG. 19 is used for the connection between the plurality of processors operating at different frequencies like that in FIG. 15.

The system 2000 according to the eighth embodiment is composed of the first processor 2005, the second processor 2007, the clock module 2001 and the like. The clock module 2001 is composed of the clock generation circuit (CPG) 2002, the frequency n-th power of 2 multiplier circuit 2004 shown in FIG. 19 and the like. The input clock signal 2003 is inputted from the clock generation circuit 2002 to the frequency n-th power of 2 multiplier circuit 2004, the generated output clock signal 2006 is outputted to the first processor 2005, and the generated output clock signal 2008 is outputted to the second processor 2007. The frequency n-th power of 2 multiplier circuit 2004 which receives the input clock signal 2003 from the clock generation circuit 2002 in the clock module 2001 generates a generated output clock signal 2006 with frequency twice the input clock signal 2003 and a generated output clock signal 2008 with octuple frequency, and supplies these signals to the plural processors with different operating frequencies (in FIG. 20, the first processor 2005 and the second processor 2007). As described in the fifth embodiment, the processors 2005 and 2007 and the clock module 2001 in the drawing may be disposed on one semiconductor chip, and the clock module 2001 may be mounted to one of the processors.

As examples where they are disposed on one semiconductor chip, a processor which operates at low-frequency clock and mainly controls a system and an engine processor which operates at high-frequency clock and mainly executes high-speed image process can be exemplified.

The circuits according to the first to eighth embodiments are formed on one or plural semiconductor substrates through the normal semiconductor manufacturing process and can be realized as a semiconductor integrated circuit device.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention can be applied to semiconductor integrated circuit devices such as microprocessor, microcontroller, signal processor, image processor and sound processor, and memories such as DRAM, SRAM and flash memory.

What is claimed is:

1. A phase synchronization circuit which delays transition timing of a third clock signal to generate a fourth clock signal based on a transition timing difference between a first clock signal and a second clock signal, said circuit comprising:

a first delay line which includes a plurality of delay elements having different delay times and to which said first clock signal is inputted;

a phase comparator line which includes a plurality of phase comparators in accordance with said first delay line and to which a signal from said first delay line and said second clock signal are inputted so as to measure a transition timing difference between said first clock signal and said second clock signal; and a second delay line which includes a plurality of delay elements having different delay times in accordance with said first delay line and to which a signal from said phase comparator line and said third clock signal are inputted, wherein the delay time of said plurality of delay elements in said first delay line and said second delay line is fixed, wherein, in said first delay line, delay time of the delay element on a first tier side where said first clock signal reaches earlier is short and delay time of the delay element on a latter tier side where said first clock signal reaches later is long.

2. The phase synchronization circuit according to claim 1, wherein a delay element on a first tier side where said first clock signal reaches earlier and a delay element on a latter tier side where said first clock signal reaches later are composed of the logically same gates using devices having different operation performances.

3. A phase synchronization circuit which delays transition timing of a third clock signal to generate a fourth clock signal based on a transition timing difference between a first clock signal and a second clock signal, said circuit comprising:

a first delay line which includes a plurality of delay elements and to which said first clock signal is inputted;

a phase comparator line which includes a plurality of phase comparators in accordance with said first delay line and to which a signal from said first delay line and said second clock signal are inputted so as to measure a transition timing difference between said first clock signal and said second clock signal; and a second delay line which includes a plurality of delay elements in accordance with said first delay line and to which a signal from said phase comparator line and said third clock signal are inputted, wherein a ratio of delay time of the delay elements in the first delay line to delay time of the delay elements in the second delay line is constant, wherein a value of said ratio of delay time of said delay elements is any value other than 1.

4. The phase synchronization circuit according to claim 3, further comprising:
a fixed delay element for phase adjustment,
wherein the ratio of the delay time of the delay elements in said first delay line to the delay time of the delay elements in said second delay line is the same as a ratio of delay time of said fixed delay element to time obtained by subtracting the delay time in said second delay line from the delay time until said fourth clock signal is outputted after said third clock signal is inputted.

5. The phase synchronization according to claim 3,
wherein a plurality of said second delay lines are provided for one first delay line.

6. A phase synchronization circuit which delays transition timing of a third clock signal to generate a fourth clock signal based on a transition timing difference between a first clock signal and a second clock signal, said circuit comprising:
a first delay line which includes a plurality of delay elements having different delay times and to which said first clock signal is inputted;
a phase comparator line which includes a plurality of phase comparators in accordance with said first delay line and to which a signal from said first delay line and said second clock signal are inputted so as to measure a transition timing difference between said first clock signal and said second clock signal; and
a second delay line which includes a plurality of delay elements having different delay times in accordance with said first delay line and to which a signal from said phase comparator line and said third clock signal are inputted,
wherein the delay time of said plurality of delay elements in said first delay line and said second delay line is fixed, and a ratio of delay time of the delay elements in the first delay line to delay time of the delay elements in the second delay line is constant,
wherein, in said first delay line, delay time of the delay element on a first tier side where said first clock signal reaches earlier is short and delay time of the delay element on a latter tier side where said first clock signal reaches later is long, and
a value of said ratio of delay time of said delay elements is any value other than 1.

* * * * *